United States Patent
Tamura

(10) Patent No.: US 9,450,581 B2
(45) Date of Patent: Sep. 20, 2016

(54) LOGIC CIRCUIT, SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Hikaru Tamura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/864,339

(22) Filed: Sep. 24, 2015

(65) Prior Publication Data

US 2016/0094224 A1  Mar. 31, 2016

(30) Foreign Application Priority Data

Sep. 30, 2014  (JP) ................................. 2014-201056

(51) Int. Cl.
  *H03K 19/096* (2006.01)
  *H03K 19/00* (2006.01)

(52) U.S. Cl.
  CPC ............................... *H03K 19/0013* (2013.01)

(58) Field of Classification Search
  None
  See application file for complete search history.

(56) References Cited

U.S. PATENT DOCUMENTS

| | | | |
|---|---|---|---|
| 4,381,460 A * | 4/1983 | Menachem | 326/88 |
| 4,473,760 A * | 9/1984 | Ambrosius et al. | 326/95 |
| 4,639,622 A * | 1/1987 | Goodwin et al. | 327/589 |
| 4,896,057 A * | 1/1990 | Yang et al. | 326/116 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,570,408 B2 | 5/2003 | Nowka | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Anh Tran
(74) *Attorney, Agent, or Firm* — Fish & Richardson P.C.

(57) ABSTRACT

A drive capability of a dynamic logic circuit is improved. A logic circuit includes a dynamic logic circuit, a first output node, a first transistor that is diode-connected, and a capacitor. The dynamic logic circuit includes a second output node. The first transistor and transistors in the dynamic logic circuit have an n-type conductivity or a p-type conductivity. The first output node is electrically connected to a first terminal of the capacitor, and the second output node is electrically connected to a second terminal of the capacitor. A first terminal of the first transistor is electrically connected to the first output node, and a first voltage is input to a second terminal of the first transistor.

16 Claims, 32 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,525,551 B2 | 9/2013 | Kato |
| 8,542,034 B2 | 9/2013 | Kato |
| 8,907,701 B2 | 12/2014 | Kong et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0216015 A1 | 10/2004 | Bernstein et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0264956 A1* | 10/2010 | Yin et al. ............... 326/120 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-009311 | 1/2013 |
| JP | 2013-009313 | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 1, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 615-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000 ° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

Imaging device 400

410

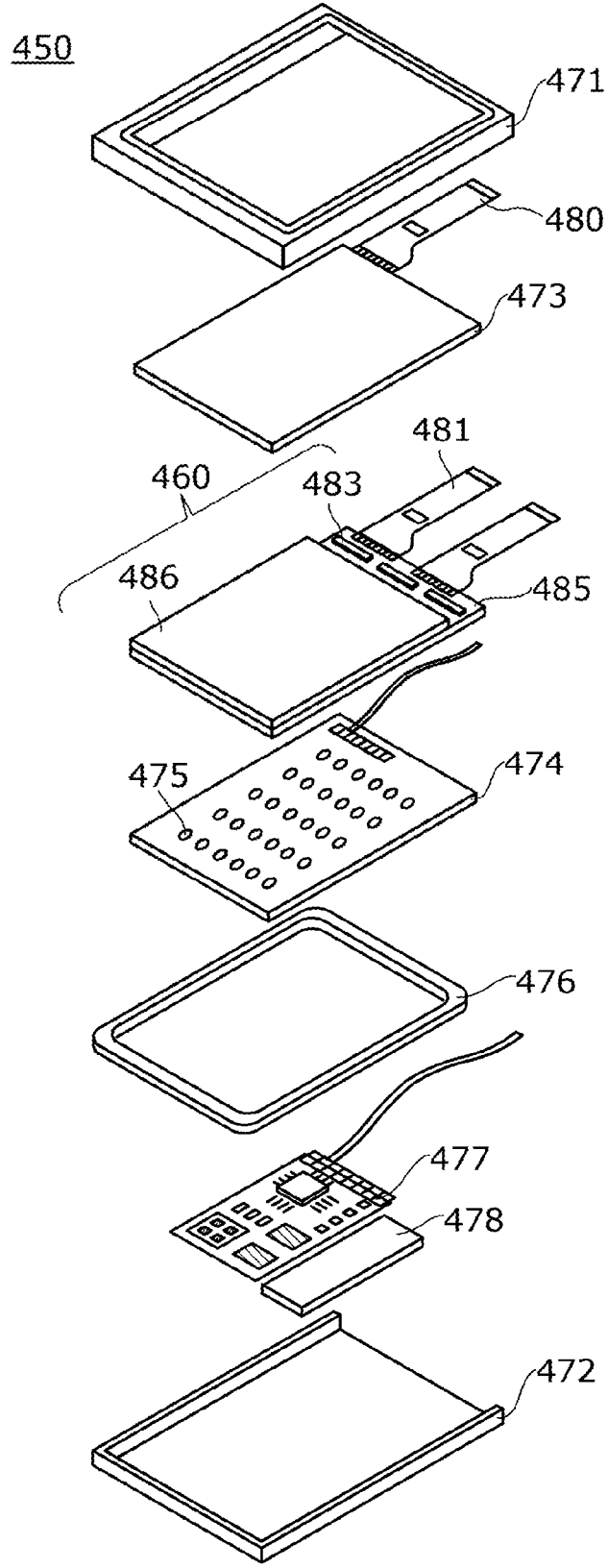

2500

2501

LOGIC CIRCUIT, SEMICONDUCTOR DEVICE, ELECTRONIC COMPONENT, AND ELECTRONIC DEVICE

BACKGROUND OF THE INVENTION

1. Field of the Invention

One embodiment of the present invention disclosed in the specification, the drawings, and the claims of this application (hereinafter referred to as "this specification and the like") relates to a logic circuit, a semiconductor device such as a processing device, a driving method thereof, a manufacturing method thereof, and the like. One embodiment of the present invention is not limited to the shown technical field. For example, one embodiment of the present invention relates to a memory device, a processing device, an imaging device, a display device, a light-emitting device, a power storage device, a driving method thereof, and a manufacturing method thereof.

2. Description of the Related Art

Logic circuits can be classified into static logic circuits, dynamic logic circuits, pseudo logic circuits, and the like. Operation of dynamic logic circuits implies to store data temporarily; thus, leakage current from transistors causes more severe problems in dynamic logic circuits than in static logic circuits. When leakage current from transistors is large, the data stored in the dynamic logic circuits is lost. Leakage current is attributed to off-state current flow when transistors are off. For example, Patent Documents 1 and 2 disclose that leakage current in dynamic logic circuits can be reduced when transistors in each of which a channel is formed using an oxide semiconductor are provided.

REFERENCE

Patent Documents

[Patent Document 1] Japanese Published Patent Application No. 2013-9311
[Patent Document 2] Japanese Published Patent Application No. 2013-9313

SUMMARY OF THE INVENTION

An object of one embodiment of the present invention is to provide a novel semiconductor device or a method for operating the novel semiconductor device. Another object of one embodiment of the present invention is to reduce power consumption or to reduce the number of elements. Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is a logic circuit including a dynamic logic circuit, a first output node, and a capacitor. The dynamic logic circuit includes a second output node. Transistors in the dynamic logic circuit have an n-type conductivity or a p-type conductivity. The first output node is electrically connected to a first terminal of the capacitor. The second output node is electrically connected to a second terminal of the capacitor. In this embodiment, the transistors in the dynamic logic circuit may each include an oxide semiconductor in which a channel is formed.

One embodiment of the present invention is a logic circuit including a dynamic logic circuit, a first output node, a first transistor, and a capacitor. The dynamic logic circuit includes a second output node. The first transistor and second transistors in the dynamic logic circuit have an n-type conductivity or a p-type conductivity. The first output node is electrically connected to a first terminal of the capacitor. The second output node is electrically connected to a second terminal of the capacitor. The first transistor is diode-connected. A first terminal of the first transistor is electrically connected to the first output node. A first voltage is input to a second terminal of the first transistor. In this embodiment, the first transistor and the second transistors in the dynamic logic circuit may each include an oxide semiconductor comprising a channel formation region.

One embodiment of the present invention can provide a novel semiconductor device or a method for operating the novel semiconductor device. For example, one embodiment of the present invention can reduce power consumption or can reduce the number of elements. Note that the description of the plurality of effects does not disturb the existence of other effects. In one embodiment of the present invention, there is no need to obtain all the effects described above. In one embodiment of the present invention, an object other than the above objects, an effect other than the above effects, and a novel feature other than the above features will be apparent from the description of the specification and the like and the drawings.

BRIEF DESCRIPTION OF THE DRAWINGS

In the accompanying drawings:

FIG. 20 is an exploded perspective view illustrating a structure example of a display device;

DETAILED DESCRIPTION OF THE INVENTION

Figure 1:
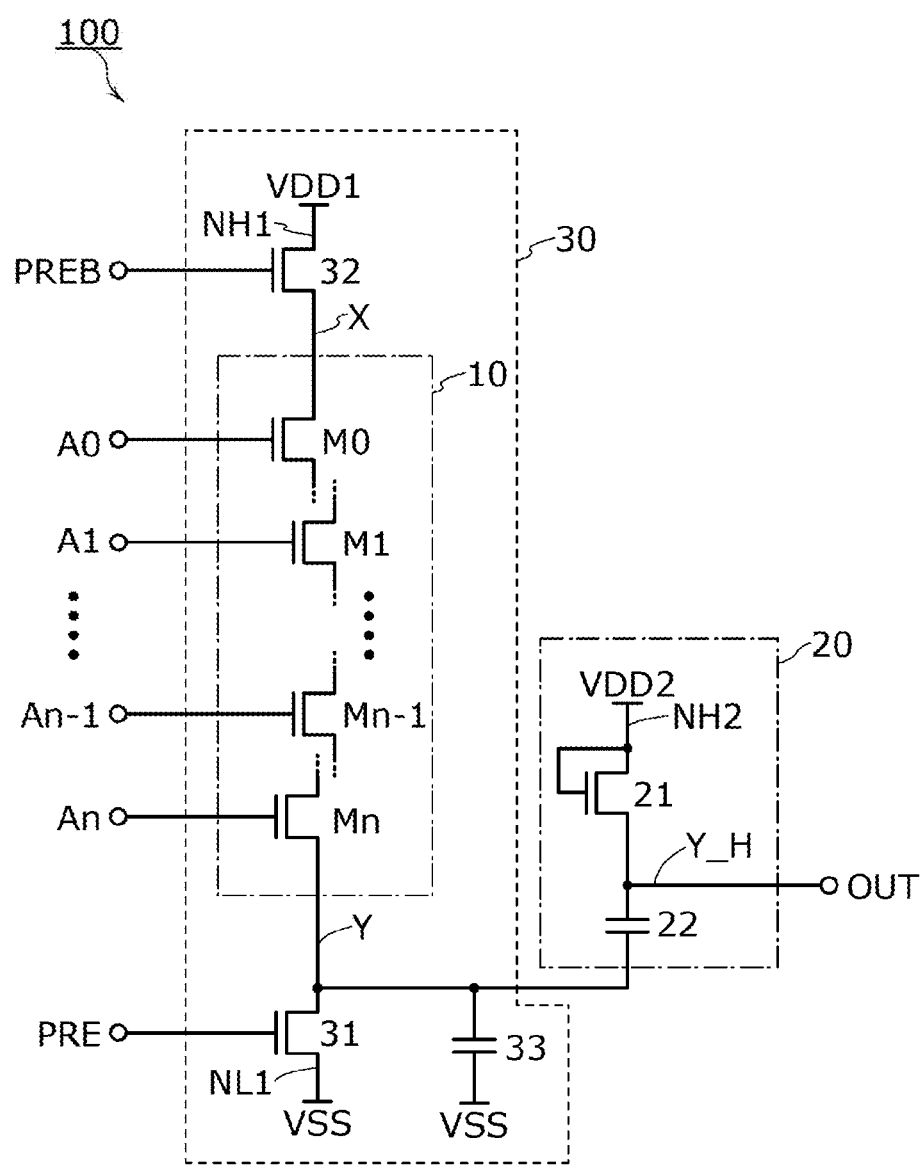
FIG. 1 is a circuit diagram showing a configuration example of a logic circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a memory device, a display device, a light-emitting device, a lighting device, an electronic device, and the like themselves might be semiconductor devices, or might each include a semiconductor device.

Furthermore, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts. Note that X and Y each denote an object (e.g., a device, an element, a circuit, a wiring, an electrode, a terminal, a conductive film, or a layer).

Note that a transistor includes three terminals: a gate, a source, and a drain. A gate is a terminal which functions as a control terminal for controlling the conduction state of a transistor. Depending on the type of the transistor or levels of potentials applied to the terminals, one of two input/output terminals functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductor, an impurity region, or the like depending on a circuit configuration, a device structure, and the like. Furthermore, a terminal and the like can be referred to as a node.

In many cases, a voltage refers to a potential difference between a certain potential and a reference potential (e.g., a ground potential (GND) or a source potential). Thus, a voltage can be referred to as a potential and vice versa. Note that the potential indicates a relative value. Accordingly, "ground potential" does not necessarily mean 0 V.

In this specification and the like, the terms "film" and "layer" can be interchanged depending on the case or circumstances. For example, in some cases, the term "conductive film" can be used instead of the term "conductive layer", and the term "insulating film" can be used instead of the term "insulating layer".

In this specification and the like, ordinal numbers such as first, second, and third are used to avoid confusion among components, and the terms do not limit the components numerically or do not limit the order.

In the drawings, the same components, components having similar functions, components formed of the same material, or components formed at the same time are denoted by the same reference numerals in some cases, and description thereof is not repeated in some cases. When the same reference numerals need to be distinguished from each other, "_1", "_2", "<n>", "[m, n]", or the like may be added to the reference numerals. For example, in the case where a plurality of wirings WL are individually distinguished from each other, the wiring WL in the second row may be described as a wiring WL[2] using a row number.

In this specification and the like, for example, a power supply voltage VDD is abbreviated to "voltage VDD", "VDD", or the like in some cases. The same applies to other components (e.g., a signal, a voltage, a potential, a circuit, an element, an electrode, and a wiring).

In the drawings, the size, the layer thickness, or the region is exaggerated for clarity in some cases. Thus, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relationship of circuit blocks in a block diagram shown in the drawing is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Embodiments of the present invention are described below, and any of the embodiments can be combined as appropriate. In addition, in the case where some structure examples are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

(Embodiment 1)

<<Configuration Example of Logic Circuit>>

FIG. 1 is a block diagram illustrating an example of a semiconductor device. A logic circuit 100 in FIG. 1 can output a signal OUT having a logic level determined by n+1 signals A0 to An. The logic circuit 100 includes a dynamic logic circuit 30 and a circuit 20. The dynamic logic circuit 30 is a logic circuit having n+1 inputs. The dynamic logic circuit 30 includes a circuit 10, a transistor 31, a transistor 32, and a capacitor 33. Here, a node Y functions as an output node of the dynamic logic circuit 30.

A node NL1 can function as a low level side power supply node to which a low power supply voltage VSS is supplied. The node NL1 is electrically connected to a wiring for supplying VSS. The node Y is precharged (initialized) during a precharge period. In the example in FIG. 1, the node Y is discharged by the precharge and the voltage of the node Y becomes a low level voltage "L". The transistor 31 is a pass transistor that controls a conduction state between the node Y and the node NL1. The transistor 31 is also referred to as a precharge control transistor. A first terminal of the capacitor 33 is electrically connected to the node Y, and a second terminal thereof is electrically connected to a wiring for supplying VSS. The capacitor 33 has a function of holding the voltage of the node Y. In the case where the voltage of the node Y can be held because of parasitic capacitance of the node Y, the capacitor 33 is not necessarily provided.

A node NH1 can function as a high level side power supply node to which a high power supply voltage VDD1 is supplied. The node NH1 is electrically connected to a wiring for supplying VDD1. The transistor 32 is a pass transistor that controls a conduction state between a node X and the node NH1. The transistor 32 is also referred to as an evaluation control transistor.

A signal PRE has a function of controlling precharge. The signal PRE is input to a gate of the transistor 31. Here, the transistor 31 and the transistor 32 have the same conductivity type, and a signal PREB, which is an inversion signal of the signal PRE, is input to a gate of the transistor 32 to perform a switching operation on the transistors 31 and 32 complementarily. Accordingly, the transistor 32 is off when the transistor 31 is on, and the transistor 32 is on when the transistor 31 is off.

<Circuit 10>

The circuit 10 is connected between the node X and the node Y. The circuit 10 includes n+1 transistors M0 to Mn (n is an integer of 0 or more).

The transistors M0 to Mn are n-channel transistors. The signals A0 to An are input to gates of the transistors M0 to Mn, respectively. The transistors M0 to Mn are electrically connected to each other in series and/or in parallel so that at least one current path exists between the node X and the node Y. Although FIG. 1 shows an example in which a drain of the transistor M0 is directly and electrically connected to the node X and a source of the transistor Mn is directly and electrically connected to the node Y, the connection structure of the circuit 10 is not limited thereto.

The circuit 10 can be referred to as an evaluation circuit or a logic circuit network. The circuit 10 performs logic evaluation of the signals A0 to An in accordance with the connection structure of the transistors M0 to Mn. When a logical condition of the signals A0 to An is established, current flows through one or a plurality of current paths (also referred to as charge paths) between the node X and the node Y and then the voltage of the node Y becomes a high level voltage "H". As described above, the circuit 10 has a function of pulling up the node Y to "H" and can be referred to as a pull-up circuit. In the evaluation operation, when the result of the logic evaluation by the circuit 10 is true, the node Y is charged and the voltage of the node Y becomes "H". When the result of the logic evaluation is false, the voltage of the node Y is not changed from the voltage set during the precharge period; thus, the node Y remains "L".

<Circuit 20>

The circuit 20 is electrically connected to the node Y. The circuit 20 includes a node Y_H, a transistor 21, and a capacitor 22. The node Y_H is an output node of the circuit 20, and also an output node of the logic circuit 100. The signal OUT is output from the node Y_H. The transistor 21 is diode-connected, and has a function of rectifying current between a node NH2 and the node Y_H. The node Y_H is capacitively coupled to the node Y via the capacitor 22. The node NH2 is a power supply node to which a high power supply voltage VDD2 is supplied. The node NH2 is electrically connected to a wiring for supplying VDD2. Here, VDD2>VDD1>VSS is satisfied.

The circuit 20 has a function of generating a voltage higher than the voltage of the node Y and can be referred to as a bootstrap circuit. The capacitor 22 is also referred to as a bootstrap capacitor, and the transistor 21 that is diode-connected is also referred to as a bootstrap diode. The circuit configuration of the circuit 20 is not limited to the example in FIG. 1. The circuit 20 may be a circuit that can perform a bootstrap operation in which the voltage of the node Y_H becomes higher than that of the node Y by capacitive coupling between the node Y_H and the node Y. To change the voltage of the node Y_H in conjunction with the voltage of the node Y, the voltage of the node Y_H is changed by capacitive coupling.

Note that the node X can be an output node of the dynamic logic circuit 30. In this case, the circuit 20 and the capacitor 33 are electrically connected to the node X.

<<Operation Example of Dynamic Logic Circuit>>

Figure 2:
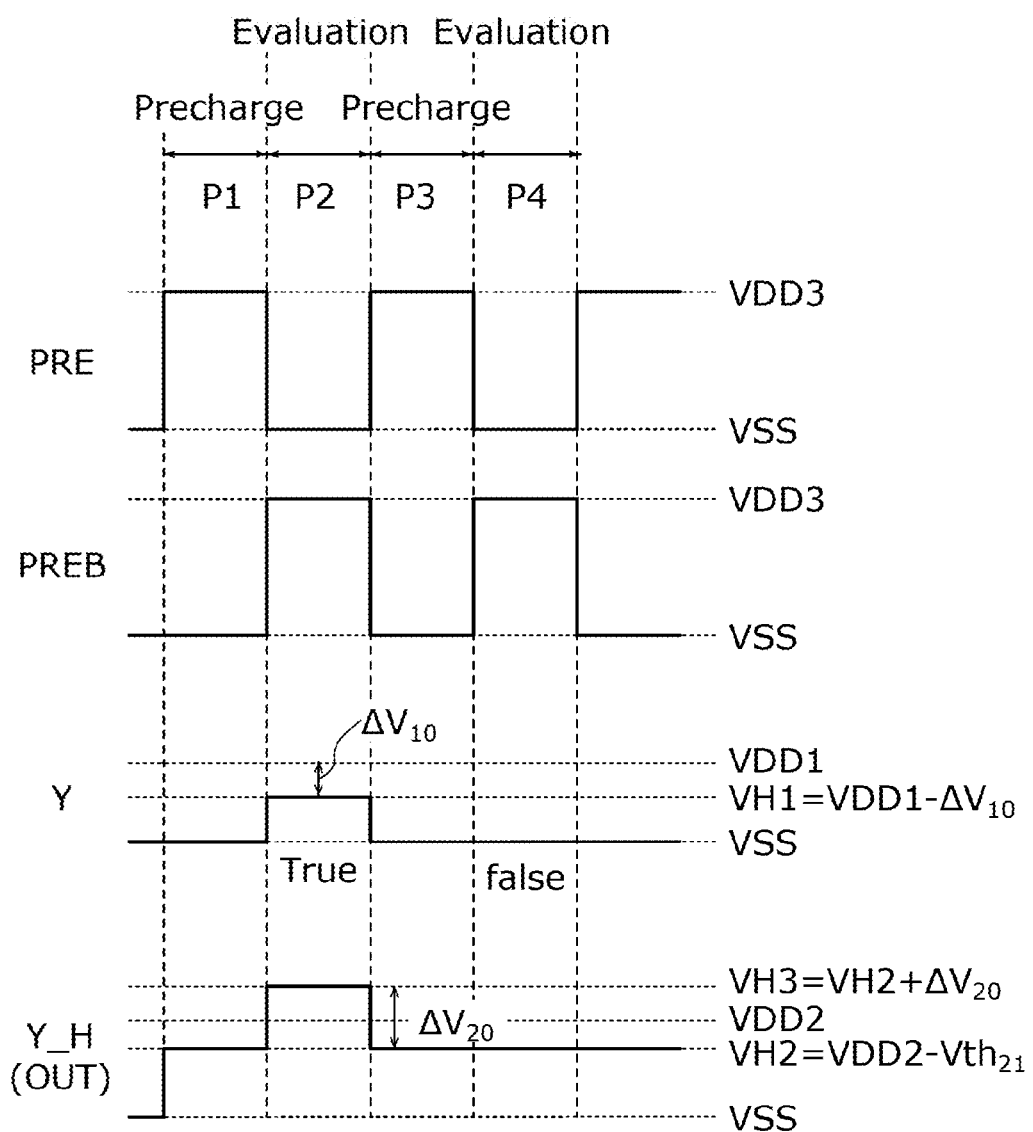
FIG. 2 is a timing chart showing an operation example of a logic circuit.

An operation example of the logic circuit 100 is described with reference to a timing chart illustrated in FIG. 2. In FIG. 2, the maximum voltages of the signal PRE and the signal PREB are VDD3 and the minimum voltages thereof are VSS. VDD3>VDD2>VDD1 is satisfied.

<Precharge>

During periods (P1 and P3) during which the signal PRE is at an H level, a precharge operation is performed in the logic circuit 100. The transistor 32 is in an off state, and the transistor 31 is in an on state. The voltage of the node Y becomes VSS and the voltage of the node Y_H becomes VH2. VH2 is a voltage lower than VDD2 by a threshold voltage $Vth_{21}$ of the transistor 21.

<Evaluation>

During periods (P2 and P4) during which the signal PRE is at an L level, an evaluation operation is performed in the logic circuit 100. The transistor 32 is in an on state, and the transistor 31 is in an off state. In FIG. 2, the logical condition of the signals A0 to An is true in the period P2, and is false in the period P4.

(Period P2)

In the period P2, the voltage of the node Y becomes an H level. The voltage of the node Y is increased from VSS to VH1. VH1=VDD1−$\Delta V_{10}$ is satisfied. The value of $\Delta V_{10}$ is determined in accordance with the number of stages of transistors that form a current path between the node Y and the node NH1 in the period P2. As the number of stages of transistors is large, $\Delta V_{10}$ is increased due to the threshold voltages of the transistors and VH1 is decreased. Because of the function of the circuit 20, the voltage of the node Y_H is increased together with the voltage of the node Y. The voltage of the node Y_H becomes a voltage VH3 higher than VH2 by $\Delta V_{20}$. As shown in a formula a1, $\Delta V_{20}$ is determined by VH1, capacitance $C_{22}$ of the capacitor 22, and parasitic capacitance $C_{YH}$ of the node Y_H.

[Formula 1]

$$\Delta V_{20} = VH1 \times \frac{C_{22}}{C_{22} + C_{YH}} \quad (a1)$$

With the circuit 20, the signal OUT at a voltage higher than the voltage of the node Y can be output. The circuit 20 can compensate for a voltage drop due to the threshold voltages of the transistor 32 and the transistors M0 to Mn in the circuit 10. Accordingly, the drive capability of a circuit in the subsequent stage of the logic circuit 100 can be improved. Alternatively, in the subsequent stage of the logic circuit 100, a circuit including transistors with high threshold voltage can be provided.

(Period P4)

During the period P4, the voltage of the node Y is maintained at the voltage VSS set by the precharge operation. Thus, the voltage of the node Y_H is not changed and is maintained at VH2. The circuit in the subsequent stage is driven in accordance with the voltage of the node Y_H in the logic circuit 100; thus, the voltage VH2 of the node Y in the logical condition of "L" is preferably lower than the threshold voltage of the transistor in the circuit in the subsequent stage. For example, VH2 can be adjusted by the high power supply voltage VDD2.

The logic circuit 100 in FIG. 1 can be formed using transistors of the same conductivity type. In the case where the logic circuit 100 is formed using transistors of the same conductivity type, the number of transistors can be reduced as compared with the case where the logic circuit 100 is formed using CMOS transistors. In addition, the number of manufacturing steps of the logic circuit 100 can be reduced; thus, the cost can be reduced and the yield can be improved.

<<Configuration Example of Logic Circuit>>

Specific circuit configuration and operation examples of the logic circuit 100 are described below with reference to FIG. 3, FIG. 4, FIG. 5, and FIG. 6.

<AND Circuit>

Figure 3:
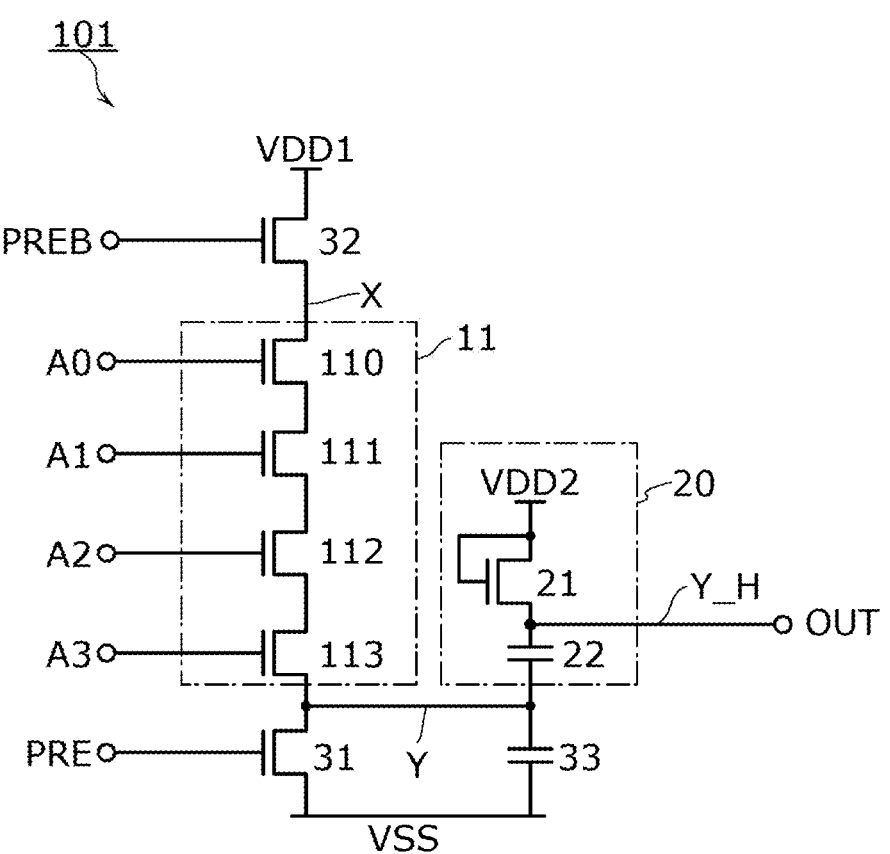
FIG. 3 is a circuit diagram showing a configuration example of a logic circuit.

A logic circuit 101 illustrated in FIG. 3 is an example of a four-input AND circuit. A circuit 11 corresponds to the circuit 10 in FIG. 1. The circuit 11 includes transistors 110 to 113 which are electrically connected to each other in series. Signals A0 to A3 are input to gates of the transistors 110 to 113.

Figure 4:
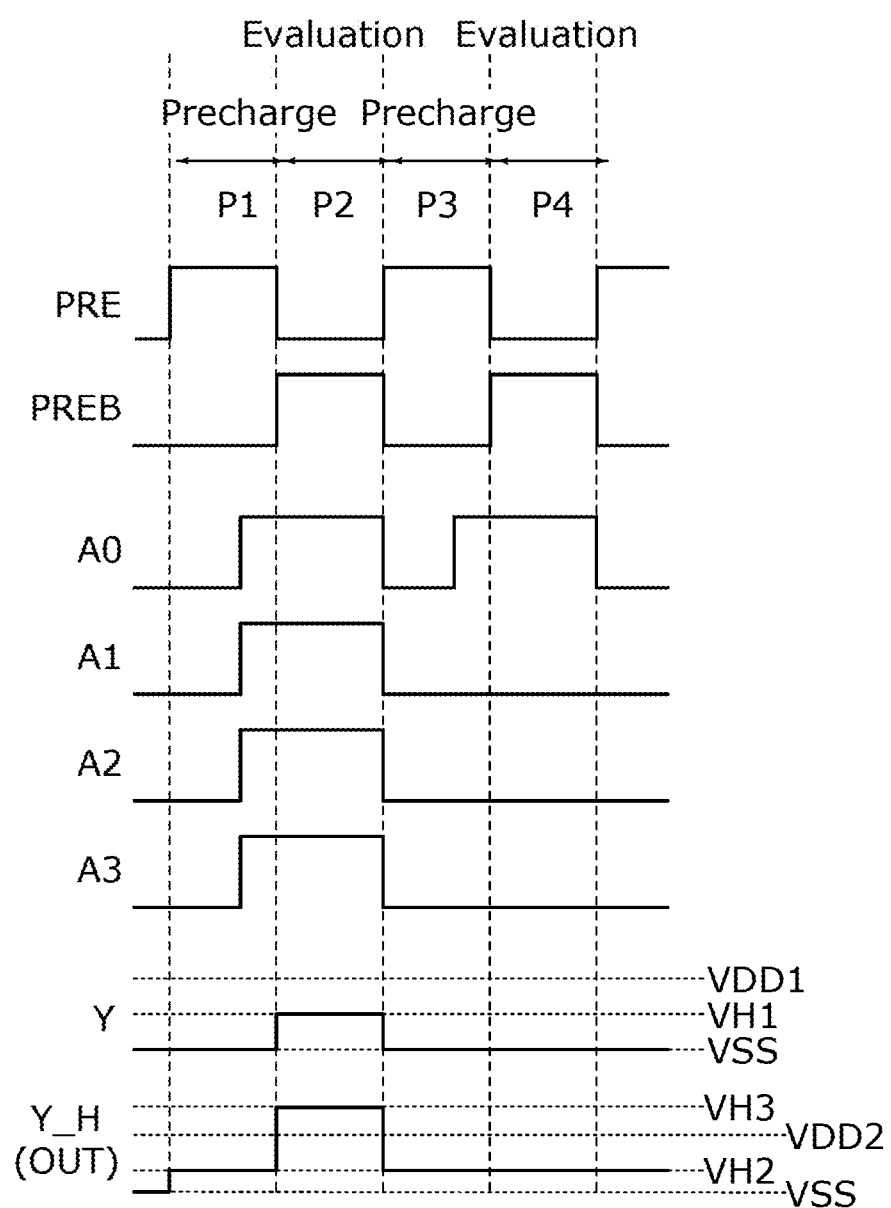
FIG. 4 is a timing chart showing an operation example of a logic circuit.

FIG. 4 is a timing chart showing the operation example of the logic circuit 101. In FIG. 4, as in FIG. 2, the logical condition of the signals A0 to A3 is true in a period P2, and is false in a period P4. During the period P2, the signals A0 to A3 are at an H level; thus, the node X and the node Y are brought into electrical contact, and the voltage of the node Y becomes an H level and the voltage of the node Y_H also becomes an H level. A signal OUT at a voltage VH3 is output from the logic circuit 101. During the period P4, only the signal A0 is "H"; thus, the node Y is maintained in an electrically floating state. Therefore, the voltages of the node Y and the node Y_H are maintained at voltages set by the precharge operation, which are VSS and VH2, respectively. In the period P4, a signal OUT at the voltage VH2 is output from the logic circuit 101.

When the transistors in the logic circuit 101 in FIG. 3 are p-channel transistors, the logic circuit 101 can function as a NAND circuit.

<OR Circuit>

Figure 5:
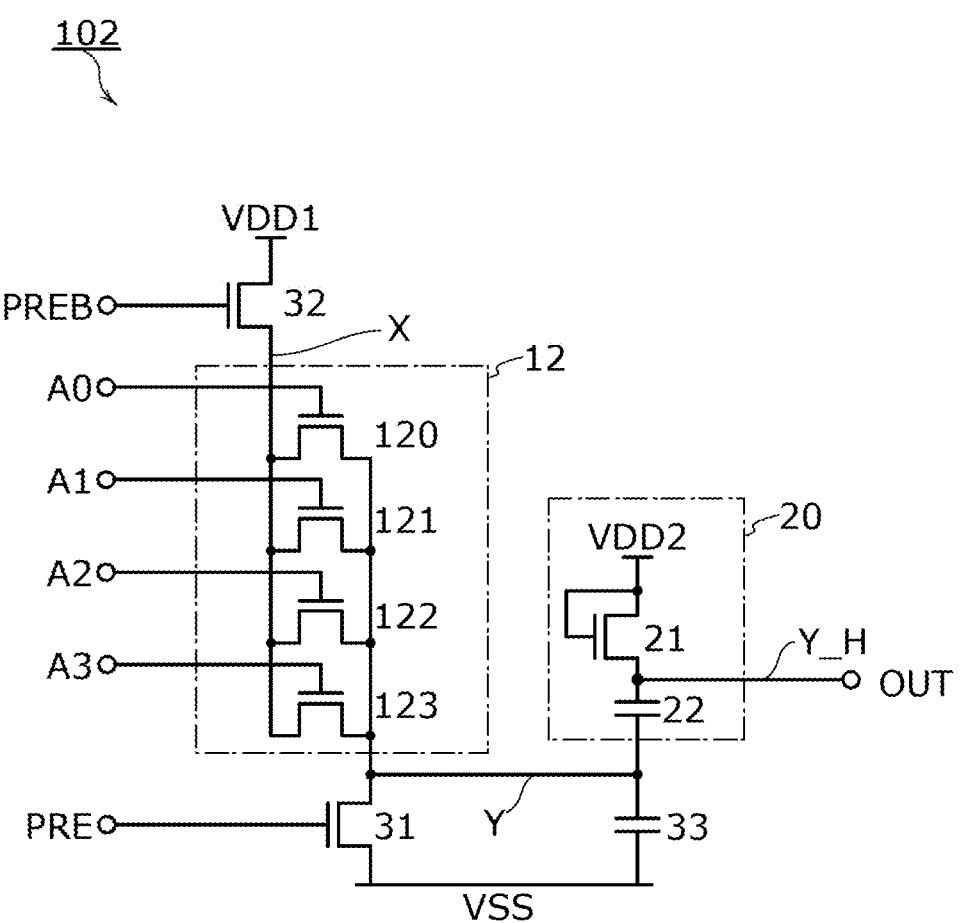
FIG. 5 is a circuit diagram showing a configuration example of a logic circuit.

A logic circuit 102 illustrated in FIG. 5 is an example of a four-input OR circuit. A circuit 12 corresponds to the circuit 10 in FIG. 1. The circuit 12 includes transistors 120 to 123 which are electrically connected to each other in parallel. Signals A0 to A3 are input to gates of the transistors 120 to 123. During the evaluation period of the logic circuit 102, when any one of the signals A0 to A3 is "H", the voltage of the node Y becomes "H", so that a signal OUT at a voltage VH3 is output. Alternatively, during the evaluation period, when all of the signals A0 to A3 are "L", the voltage of the node Y remains "L", so that a signal OUT at a voltage VH2 is output.

When the transistors in the logic circuit 102 in FIG. 5 are p-channel transistors, the logic circuit 102 can function as a NOR circuit.

<AND-OR Circuit>

Figure 6:
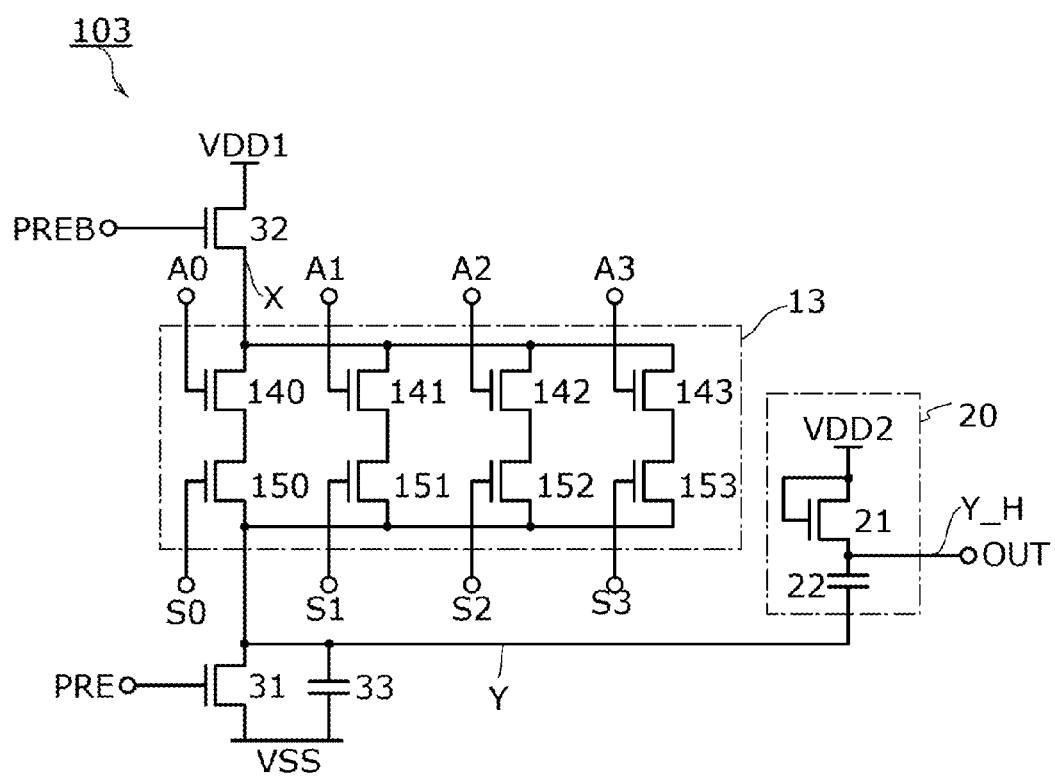
FIG. 6 is a circuit diagram showing a configuration example of a logic circuit.

A logic circuit 103 illustrated in FIG. 6 is an example of an AND-OR circuit. A circuit 13 corresponds to the circuit 10 in FIG. 1, and includes transistors 140 to 143 and transistors 150 to 153. Signals A0 to A3 and signals S0 to S3 are input to the circuit 13. The logic circuit 103 can function as a four-input multiplexer (selection circuit). For example, the signals A0 to A3 serve as data signals, and the signals S0 to S3 serve as signals which select a data signal to be output. During the evaluation period, any one of the signals S0 to S3 is at an H level. When only the signal S1 is "H", a signal OUT at a potential level corresponding to the signal S1 is output. When the signal S1 is at an H level, a signal OUT at a voltage VH3 (H level) is output, and when the signal S1 is at an L level, a signal OUT at a voltage VH2 (L level) is output.

If the node X serves as an output node of the dynamic logic circuit, the logic circuit 101 can function as a NAND circuit, and the logic circuit 102 can function as a NOR circuit. In the case where an "H" voltage of the node X has a value at which the circuit in the subsequent stage can be driven normally, the circuit 20 is not necessarily provided. Therefore, in the case where a functional circuit is configured by a combination of a plurality of dynamic logic circuits, a circuit configuration in which the circuit 20 is not provided in a dynamic logic circuit where a signal is output from a node X (a node whose voltage becomes "L" when the evaluation condition is true) and the circuit 20 is provided in a dynamic logic circuit where a signal is output from a node Y (a node whose voltage becomes "H" when the evaluation condition is true) may be employed, whereby the area overhead due to the addition of the circuit 20 can be reduced.

<<Circuit Simulation>>

A transistor whose channel is formed in an oxide semiconductor (hereinafter referred to as an "OS transistor" in some cases) has an extremely low off-state current. In order to make the off-state current of the transistor extremely low, a channel of the transistor is formed in a semiconductor whose bandgap is wide, for example, a semiconductor whose band gap is greater than or equal to 3.0 eV. As an example of such a semiconductor, an oxide semiconductor containing a metal oxide can be given. Consequently, an OS transistor has low leakage current due to thermal excitation and extremely low off-state current.

Extremely low off-state current means that, for example, off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), further preferably lower than or equal to 10 yA/μm (y represents yocto and denotes a factor of $10^{-24}$).

As an oxide contained in a semiconductor layer of an OS transistor, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. In addition, these oxides may contain another material, such as $SiO_2$. An oxide semiconductor of an OS transistor preferably contains at least one of In and Zn.

By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer. Note that the oxide semiconductor and the OS transistor are described in detail in Embodiment 4.

The OS transistor has a threshold voltage higher than that of a Si transistor formed using a silicon wafer. In the case where a dynamic logic circuit includes OS transistors, due to the threshold voltages of the OS transistors, a voltage of a signal may be lowered, and a malfunction may occur in a circuit connected to a last stage of the dynamic logic circuit. The dynamic logic circuit in this embodiment can solve the threshold voltage drop problem. The above is confirmed by circuit simulation.

Figure 7:
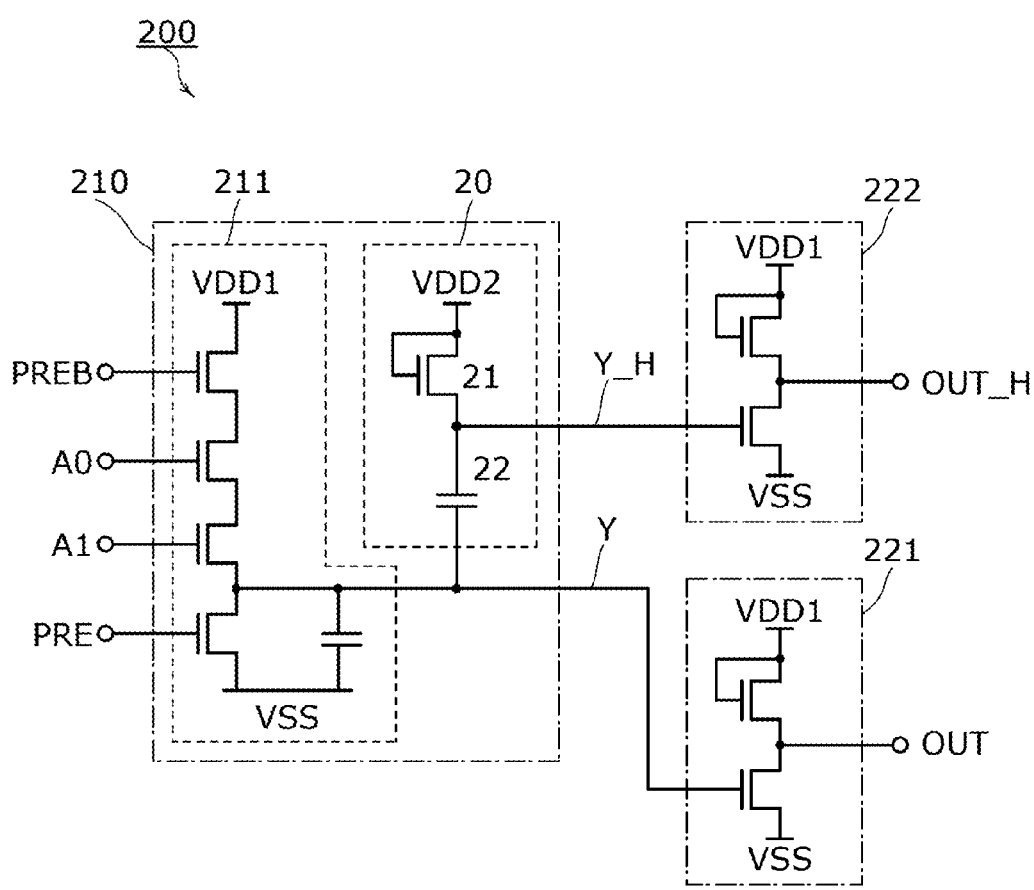
FIG. 7 is a circuit diagram of a logic circuit on which simulation is performed.

A logic circuit 200 illustrated in FIG. 7 is a circuit on which simulation is performed. Transistors in the logic circuit 200 are all n-channel transistors and are assumed to be OS transistors. The logic circuit 200 includes a two-input AND circuit 210 (hereinafter referred to as "AND 210"), a circuit 221, and a circuit 222. An AND 210 includes a dynamic logic circuit 211 and the circuit 20. The circuits 221 and 222 are logic circuits having a NOT logical operation function (inverter). An input node of the circuit 221 is electrically connected to a node Y, and an input node of the circuit 222 is electrically connected to a node Y_H. A node OUT is an output node of the circuit 221, and a node OUT_H is an output node of the circuit 222.

Figure 8:
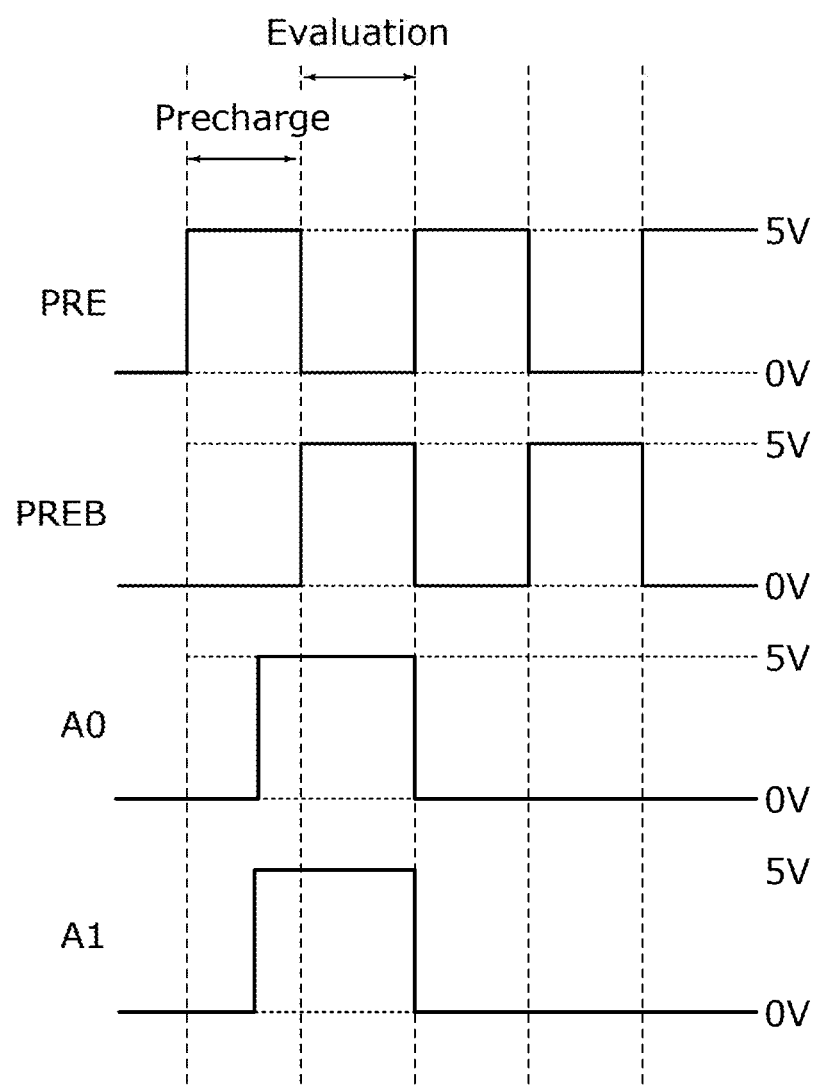
FIG. 8 is a timing chart of the logic circuit shown in FIG. 7.
Figure 9A:
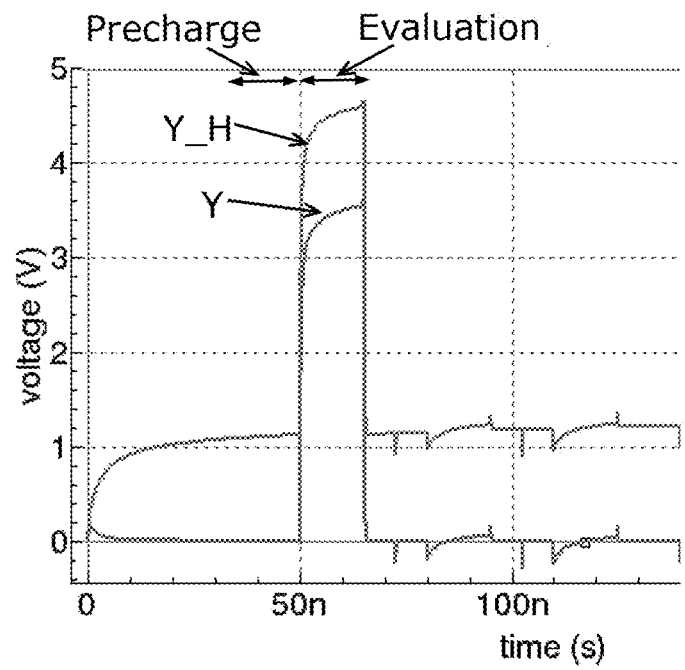
FIGS. 9A and 9B are graphs showing simulation results.
Figure 9B:
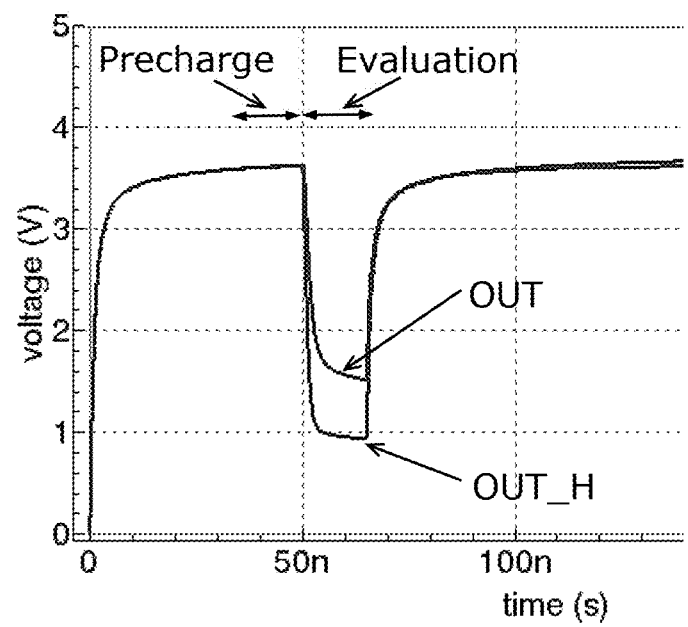

In the circuit simulation, the operation of the AND 210 is verified from changes in voltage of the nodes OUT and OUT_H of the circuits 221 and 222. FIG. 8 is a timing chart of the logic circuit 200. FIGS. 9A and 9B show circuit simulation results. FIG. 9A shows changes in voltage of the nodes Y and Y_H, and FIG. 9B shows changes in voltage of the nodes OUT and OUT_H. Here, VSS, VDD1, and VDD2 are 0 V, 5 V, and 2.5 V, respectively. The maximum voltage of signals PRE, PREB, A0, and A1 is 5 V, and the minimum voltage thereof is 0 V. The precharge period is a period during which the signal PRE is at a high level, and the evaluation period is a period during which the signal PRE is at a low level. The precharge period and the evaluation period are each 15 nanoseconds.

In the precharge period, the voltage of the node Y becomes 0 V. The voltage of the node Y_H is boosted by the circuit 20. The voltage of the node Y_H becomes approximately 1.2 V which is lower than VDD2 by the threshold voltage of the transistor 21. The nodes OUT and OUT_H each become approximately 3.5 V.

Here, signals A0 and A1 whose evaluation result is true are input, so that the logic levels of the nodes Y and Y_H become "H". Thus, the circuits 221 and 222 output signals having logic levels of "L". The voltage of the node Y rises to approximately 3.5 V while the voltage of the node Y_H is boosted to approximately 4.5 V by a bootstrap operation of the circuit 20. FIG. 9B shows a result of driving the circuits 221 and 222 by the output signals of the nodes Y and Y_H. The voltage of the node OUT of the circuit 221 becomes approximately 1.5 V, and the voltage of the node OUT_H of the circuit 222 is decreased to lower than 1 V. Since the "H" voltages of the nodes Y and Y_H are different from each other, the voltage difference between the node OUT and the node OUT_H is generated. FIGS. 9A and 9B show that the drive capability of the AND 210 is improved by the circuit 20.

Here, the voltage of the node Y_H at "L" is approximately 1 V; however, if a threshold voltage of a transistor in a circuit connected to the node Y_H is higher than 1 V, the transistor stays in an off state. The voltage of the node Y_H at "L" can be adjusted by a high power supply voltage VDD2 used for the circuit 20. VDD2 may be set in accordance with a threshold voltage of a transistor in a circuit connected to the node Y_H, threshold voltages of transistors in the dynamic logic circuit 211, or the like.

According to this embodiment, even if transistors having a high threshold voltage are included, a dynamic logic circuit with high drive capability can be provided. In addition, the dynamic logic circuit of this embodiment can drive a transistor having a high threshold voltage.

As a logic circuit including n-channel transistors, a pseudo logic circuit is known. A dynamic logic circuit can be driven with lower power than the pseudo logic circuit. Thus, according to this embodiment, a logic circuit including transistors of the same conductivity type can achieve low power consumption and high-speed operation. For example, according to this embodiment, with an OS transistor, various logic circuits with high drive capability and low power consumption can be provided. The OS transistor can operate even in a high-temperature environment (e.g., 100° C. or higher) in which it is difficult for a Si transistor to operate; thus, according to this embodiment, various functional circuits that can function in the high-temperature environment and electronic devices including any of the functional circuits can be provided.

In Embodiment 1, one embodiment of the present invention has been described. Other embodiments of the present invention are described in Embodiments 2 to 4. Note that one embodiment of the present invention is not limited to the above examples. In other words, various embodiments of the invention are described in this embodiment and the other embodiments, and one embodiment of the present invention is not limited to a particular embodiment. Although an example in which one embodiment of the present invention is used in a dynamic circuit is described, one embodiment of the present invention is not limited thereto. Depending on circumstances or conditions, one embodiment of the present invention may be used in a static circuit. Alternatively, depending on circumstances or conditions, one embodiment of the present invention is not necessarily used in a dynamic circuit. Although an example in which one embodiment of the present invention is used in a logic circuit is described, one embodiment of the present invention is not limited thereto. Depending on circumstances or conditions, one embodiment of the present invention may be used in a circuit other than a logic circuit. Alternatively, depending on circumstances or conditions, one embodiment of the present invention may be used in an analog circuit.

(Embodiment 2)

In this embodiment, a semiconductor device including the dynamic logic circuit of Embodiment 1 is described.

There is a known semiconductor device that includes a circuit array including a plurality of circuits arranged in array, wirings corresponding to the arrangement of the circuits, and peripheral circuits for driving the circuit array. Typical examples include a memory device in which a plurality of memory cells are arranged in array (e.g., a DRAM, an SRAM, or a flash memory), an imaging device having a plurality of pixels (an image sensor), and an active matrix display device having a plurality of pixels (e.g., a liquid crystal display device, an electroluminescence (EL) display device, or a MEMS display device). As a peripheral circuit for driving the circuits in the circuit array, the dynamic logic circuit of Embodiment 1 can be used.

<<Memory Device>>

Figure 10:
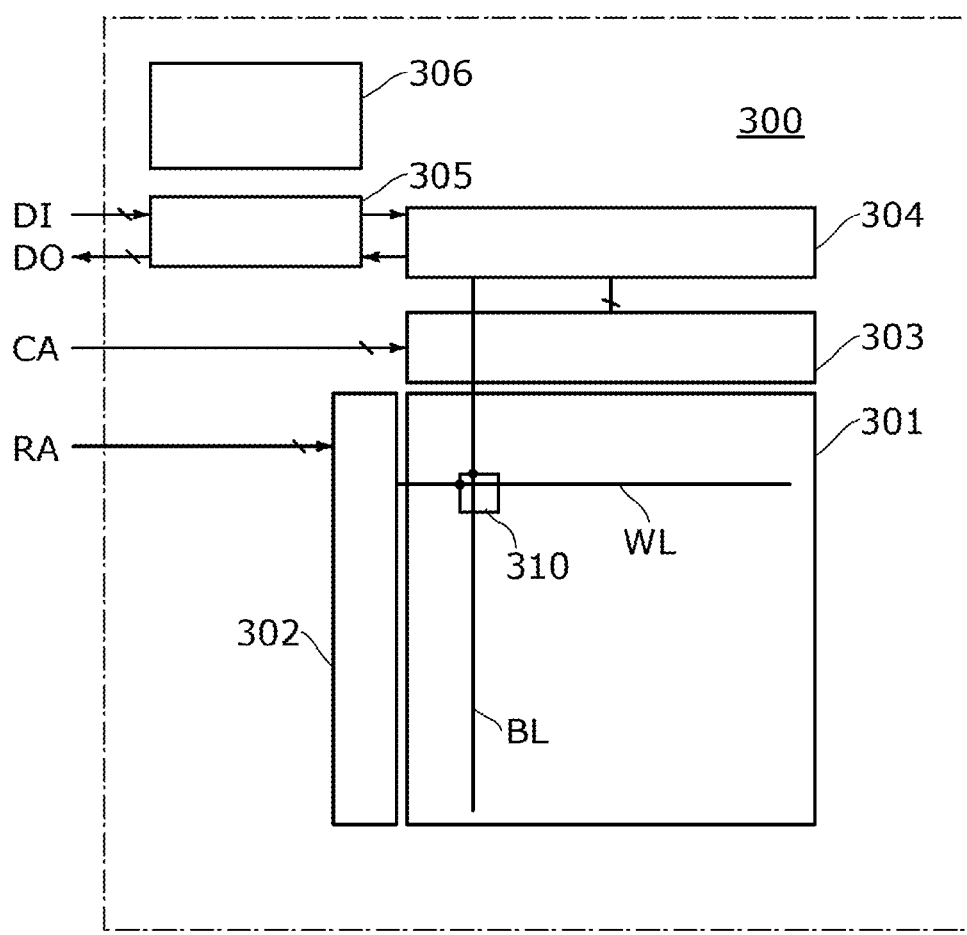
FIG. 10 is a block diagram showing a configuration example of a memory device.

FIG. 10 is a block diagram showing a configuration example of a memory device. A memory device 300 in FIG. 10 can be used as a dynamic random access memory. The memory device 300 includes a memory cell array 301, a row decoder 302, a column decoder 303, a column driver 304, an input/output circuit 305, and a control circuit 306.

The control circuit 306 is a circuit for controlling the whole memory device 300. The control circuit 306 has a function of decoding command signals input from the outside. The control circuit 306 controls circuits included in the memory device 300 on the basis of decoded command data, command data stored in the control circuit 306, or the like.

The memory cell array 301 includes a plurality of memory cells 310, a plurality of wirings BL, and a plurality of wirings WL. The plurality of memory cells 310 are arranged in array. In accordance with the arrangement of the memory cells 310, the wirings WL are provided in the respective rows and the wirings BL are provided in the respective columns A signal RA is a row address signal. The row decoder 302 has a function of decoding the signal RA. The wiring WL in a row specified by the signal RA is selected by the row decoder 302. A signal CA is a column address signal. The column decoder 303 has a function of decoding the signal CA.

The input/output circuit 305 has a function of controlling an input of a data signal DI, a function of controlling an output of a data signal DO, and the like. The data signal DI is a data signal to be written, and the data signal DO is a data signal read from the memory cell array 301. Writing of the signal DI and reading out of the signal DO are performed by a column driver 304. The column driver 304 has a function of reading out data from the wiring BL in a row specified by the row decoder 303 and a function of writing data to the wiring BL. For example, the column driver 304 includes a switch, a sense amplifier (also referred to as a sense latch), a precharge circuit, and the like. The switch has a function of controlling a conduction state between the column driver 304 and the input/output circuit 305. The sense amplifier operates when data is read out. The sense amplifier has a function of sensing and amplifying a voltage between the pair of wirings BL. A signal amplified by the sense amplifier is output to the input/output circuit 305 through the switch. The precharge circuit operates when data is written, and has a function of precharging the wiring BL.

<Memory Cell>

Figure 11A:
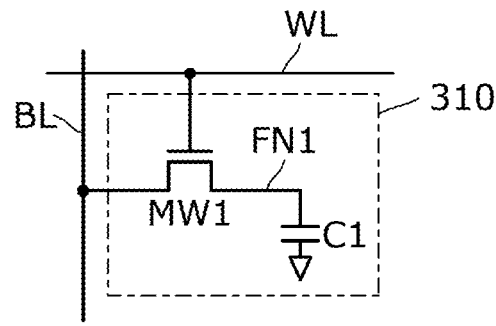
FIGS. 11A to 11C are circuit diagrams showing configuration examples of a memory cell.

FIG. 11A shows an example of the memory cell 310. The memory cell 310 has a circuit configuration of one transistor and one capacitor (1T1C), and includes a transistor MW1, a capacitor C1, and a node FN1. The node FN1 serves as a data holding node. The capacitor C1 is a storage capacitor for holding the potential of the node FN1. The transistor MW1 is a write transistor. The conduction state of the transistor MW1 is controlled by a selection signal potential input to the wiring WL.

To lengthen the data retention period of the memory cell 310, the transistor MW1 preferably has a small off-state current. Then, an OS transistor is preferably used as the transistor MW1. Accordingly, the memory cell 310 can be used as a nonvolatile memory element. In this case, a voltage that turns off the transistor MW1 completely may be continuously applied to a gate. Alternatively, in the case where a back gate is provided for the transistor MW1, a voltage that brings the transistor MW1 into a normally-off state may be continuously applied to the back gate. In these cases, although a voltage is supplied to the memory cell 310 in the data retention period, little power is consumed because almost no current flows. Because of little power consumption, the memory cell 310 can be regarded as being substantially nonvolatile even if a predetermined voltage is supplied to the memory cell 310 in the data retention period.

<Decoder>

Figure 12:
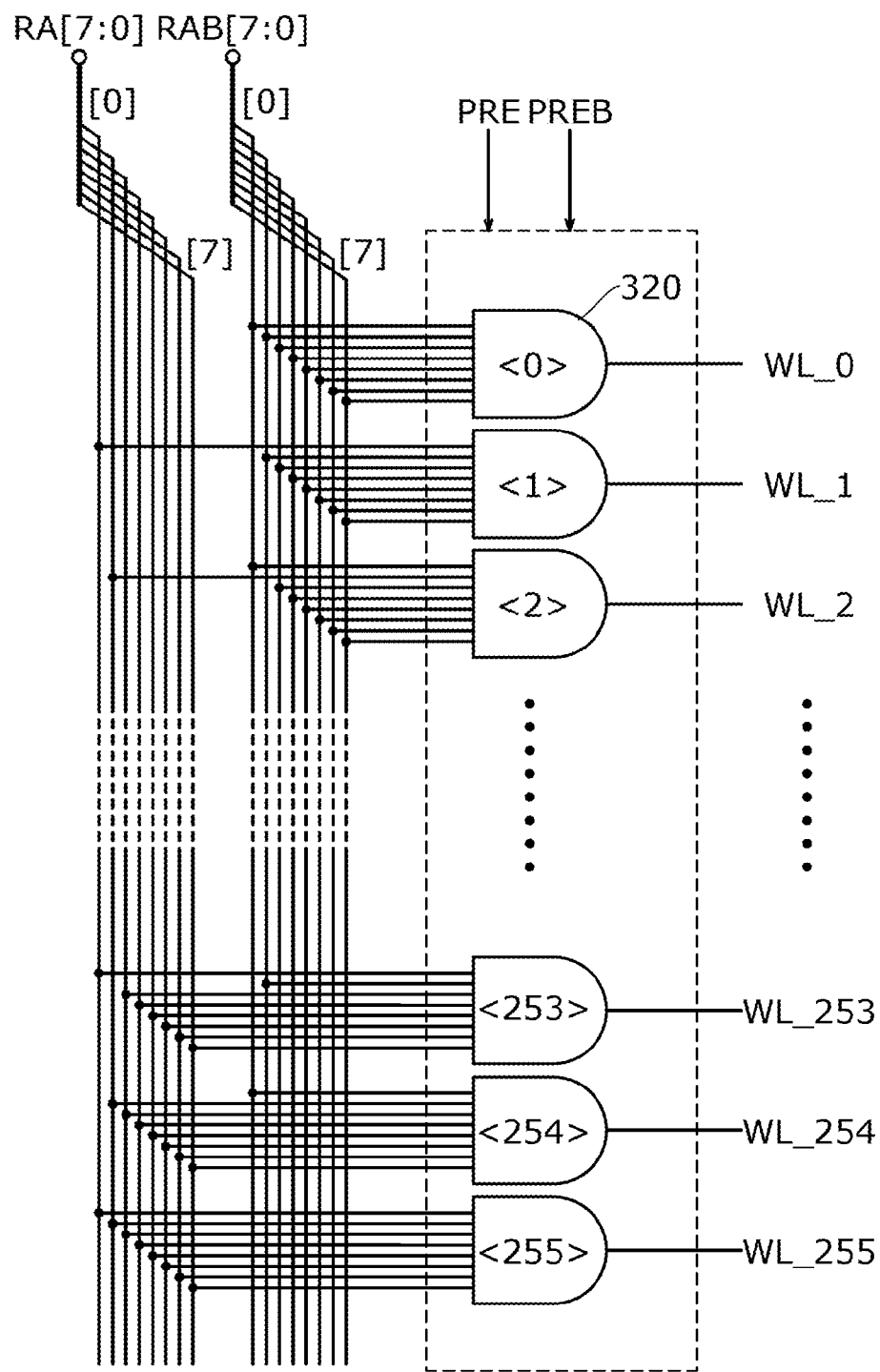
FIG. 12 is a circuit diagram showing a configuration example of a row decoder.

FIG. 12 shows a configuration example of the row decoder 302. Here, the signals RA are 8-bit signals. To the row decoder 302, the signals RA [7:0], RAB [7:0], PRE, and PREB are input. The signal RAB is an inversion signal of the signal RA. An example in which the signal RAB is input from the outside of the memory device 300 is shown; however, the signal RAB may be generated from the signal RA in the memory device 300, for example, in the control circuit 306 or the row decoder 302.

Figure 13:
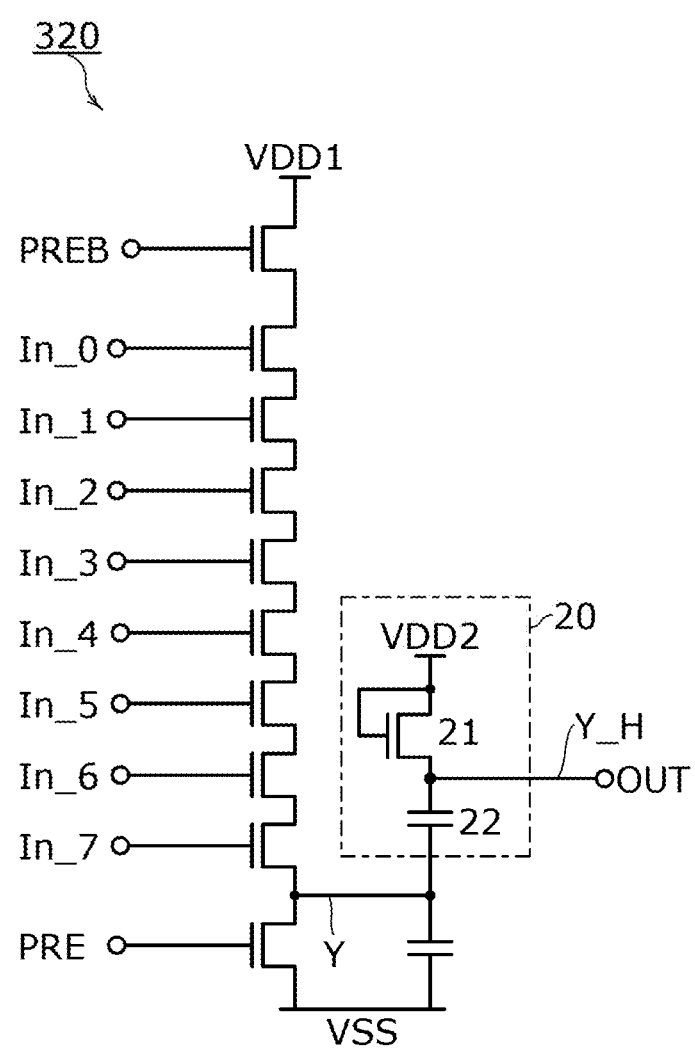
FIG. 13 is a circuit diagram showing a configuration example of an AND circuit.

The row decoder 302 includes 256 AND circuits 320 (hereinafter referred to as "AND 320"), and can select any of 256 wirings WL_0 to WL_255. An AND 320 is an eight-input logic circuit. FIG. 13 shows a configuration example of an AND 320. The AND 320 in FIG. 13 is a dynamic logic circuit including transistors of the same conductivity type. Input signals In_j (j is an integer from 0 to 7) are the signal RA [j] or the signal RAB [j]. The signal OUT is output to the wiring WL in the corresponding row. For example, a wiring WL_1 is electrically connected to an output of AND 320 <1>. A signal RA[0] and signals RAB [7:1] are input to AND 320 <1>. When the signals RA [7:0] are "00000001", the logical condition of AND 320 <1> only becomes true, so that a selection signal at "H" is output to the wiring WL_1.

The AND 320 of FIG. 13 can operate at high speed with low power consumption because it is a dynamic logic circuit. In addition, the AND 320 has high drive capability because it is provided with the circuit 20. Even if the transistor MW1 of the memory cell 310 is a transistor having a high threshold voltage, such as an OS transistor, a voltage higher than the threshold voltage can be input to the gate of the transistor MW1 by using the AND 320. The row decoder 302 is formed using dynamic logic circuits including transistors of the same conductivity type; thus, a large number of wirings WL can be driven with a small number of transistors. As a result, the capacity of the memory cell array 301 can be easily increased.

Furthermore, since the memory cell array 301 and the row decoder 302 can include transistors of the same conductivity type, the memory cell array 301 and the row decoder 302 can include only OS transistors. In this case, the memory cell array 301 and the row decoder 302 are formed on the same substrate through the same process, whereby a chip where they are integrated can be formed. In addition, the column decoder 303 can have a circuit configuration similar to that of the row decoder 302. Therefore, the OS transistors offer a chip where the memory cell array 301, the row decoder 302, and the column decoder 303 are integrated.

<Device Structure 1>

Figure 14:
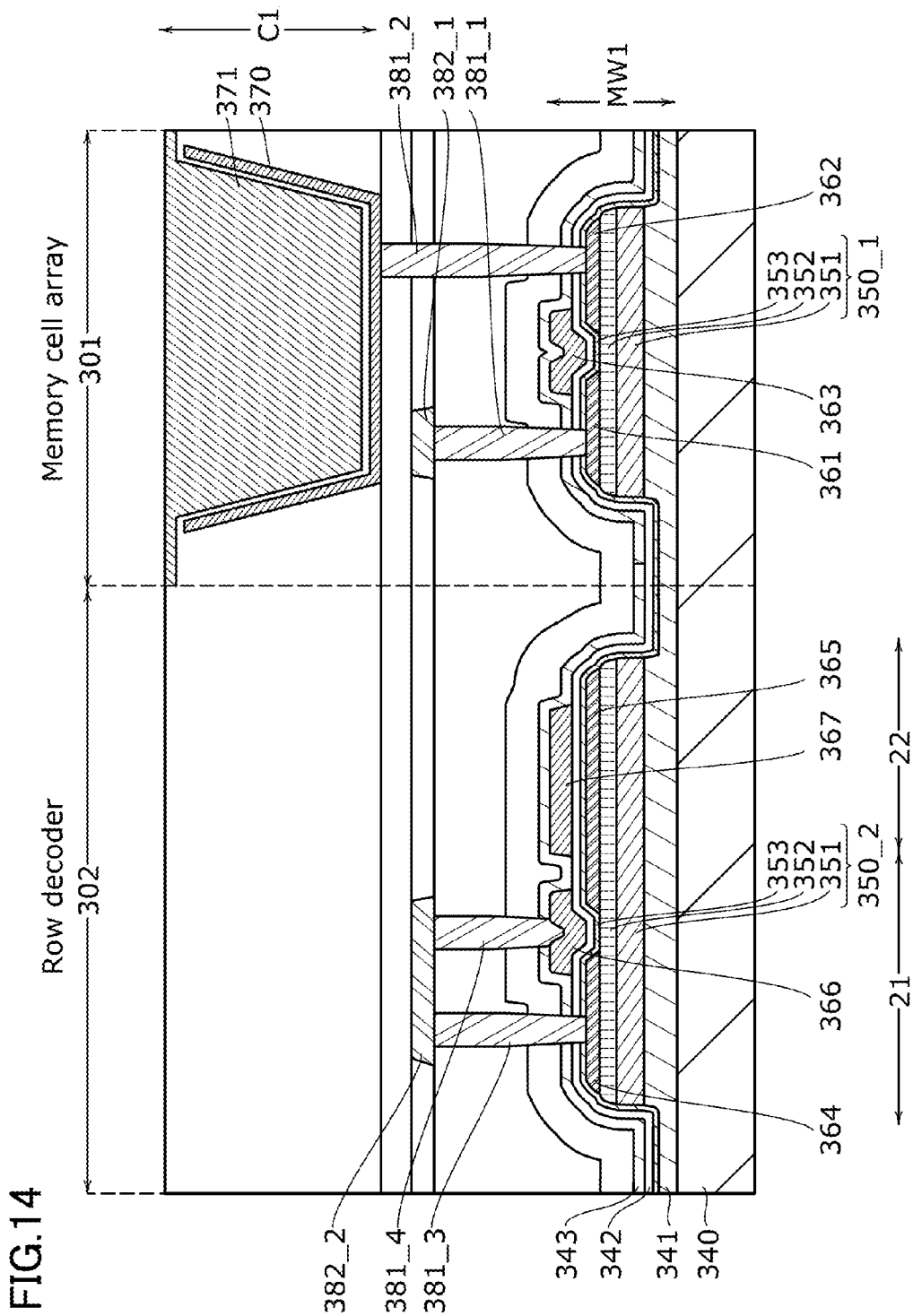
FIG. 14 is a cross-sectional view illustrating a structure example of a memory device.

FIG. 14 shows an example of a device structure of a chip including OS transistors. FIG. 14 shows a cross-sectional structure of the row decoder 302 and the memory cell array 301. Here, particularly, the memory cell 310 (the transistor MW1 and the capacitor C1) and the circuit 20 of the AND 320 (the transistor 21 and the capacitor 22) are shown.

In FIG. 14, regions where reference numerals and hatching patterns are not given show regions formed of an insulator. In these regions, an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, a resin such as a polyimide resin, a polyamide resin, an acrylic resin, a siloxane resin, an epoxy resin, or a phenol resin can be used.

An insulating layer 341 is provided over a substrate 340. Over the insulating layer 341, the transistor MW1, the transistor 21, and the capacitor 22 are provided. They are covered with an insulating layer 343. An insulating layer 342 serves as a gate insulating layer of each of the transistors MW1 and 21, and also serves as a dielectric layer of the capacitor 22. The transistors MW1 and 21 are OS transistors. Details of the OS transistor will be described in Embodiment 4. Here, the transistors MW1 and 21 each have a device structure similar to that of an OS transistor 502 illustrated in FIG. 31A.

The insulating layer 343 preferably includes at least one layer which is formed using an insulator that has a blocking effect against hydrogen, water, and the like. Water, hydrogen, and the like are factors that generate carriers in an oxide semiconductor layer; therefore, a blocking layer against hydrogen, water, and the like can improve the reliability of the transistors MW1 and 21. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ). Note that in this specification, an oxynitride refers to a substance that contains more oxygen than nitrogen, and a nitride oxide refers to a substance that contains more nitrogen than oxygen.

The transistor MW1 includes an oxide semiconductor layer 350_1 and conductive layers 361 to 363. The transistor 21 includes an oxide semiconductor layer 350_2 and conductive layers 364 to 366. The capacitor 22 includes the conductive layer 365 and a conductive layer 367. The oxide semiconductor layers 350_1 and 350_2 include oxide semiconductor layers 351 to 353. The capacitor C1 is stacked over the transistor MW1. The capacitor C1 is a cylindrical capacitor and includes conductive layers 370 and 371. The conductive layer 371 is shared with a plurality of capacitors C1. The transistor MW1 and the capacitor C1 are electrically connected to plugs 381_1 and 381_2 and a conductive layer 382_1 so as to function as the memory cell 310. The conductive layer 364 and the conductive layer 366 of the transistor 21 are electrically connected to each other with plugs 381_3 and 381_4 and a conductive layer 382_2.

Here, a semiconductor substrate is used as the substrate 340. The semiconductor substrate is not limited to a single crystal silicon substrate, and the semiconductor substrate can be, for example, a single-material semiconductor substrate of silicon, germanium, or the like or a compound semiconductor substrate of silicon carbide, silicon germanium, gallium arsenide, gallium nitride, indium phosphide, zinc oxide, gallium oxide, or the like. Alternatively, a substrate other than a semiconductor substrate can be used. For example, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base film, and the like can be used. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. Examples of a base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability or high heat resistance can be provided, or reduction in weight or thickness can be achieved.

An insulator included in the chip illustrated in FIG. 14 can have a single-layer structure or a layered structure including two or more layers. Examples of an insulating material include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, an organic resin such as a polyimide resin, a polyamide resin, an acrylic resin, a siloxane resin, an epoxy resin, or a phenol resin can be used.

A conductor included in the chip illustrated in FIG. 14 can have a single-layer structure or a layered structure including two or more layers. Examples of a conductive material include low-resistance metals such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co); an alloy mainly containing one or more of these metals; and a compound mainly containing one or more of these metals. It is particularly preferable to use a high-melting-point material that has both heat resistance and conductivity, such as tungsten or molybdenum. In addition, a heat-resistant conductive material containing aluminum, copper, or the like is preferably used. For example, a Cu—Mn alloy is preferably used because manganese oxide formed at the interface with an insulator containing oxygen has a function of suppressing Cu diffusion.

A sputtering method and a plasma-enhanced chemical vapor deposition (PECVD) method are typical examples of a method of forming an insulating film, a conductive film, a semiconductor film, and the like included in a semiconductor device. The insulating film, the conductive film, the semiconductor film, and the like can be formed by another method, for example, a thermal CVD method. A metal organic chemical vapor deposition (MOCVD) method or an atomic layer deposition (ALD) method can be employed as a thermal CVD method, for example.

<Device Structure 2>

In the memory device 300 in FIG. 10, the circuits other than the memory cell array 301, the row decoder 302, and the column decoder 303 may be formed using transistors other than OS transistors, for example, Si transistors. In this case, a circuit including OS transistors is stacked over a circuit including Si transistors, whereby the memory device 300 can be integrated in one chip. An example of a device structure of such a chip is illustrated in FIG. 15.

Figure 15:
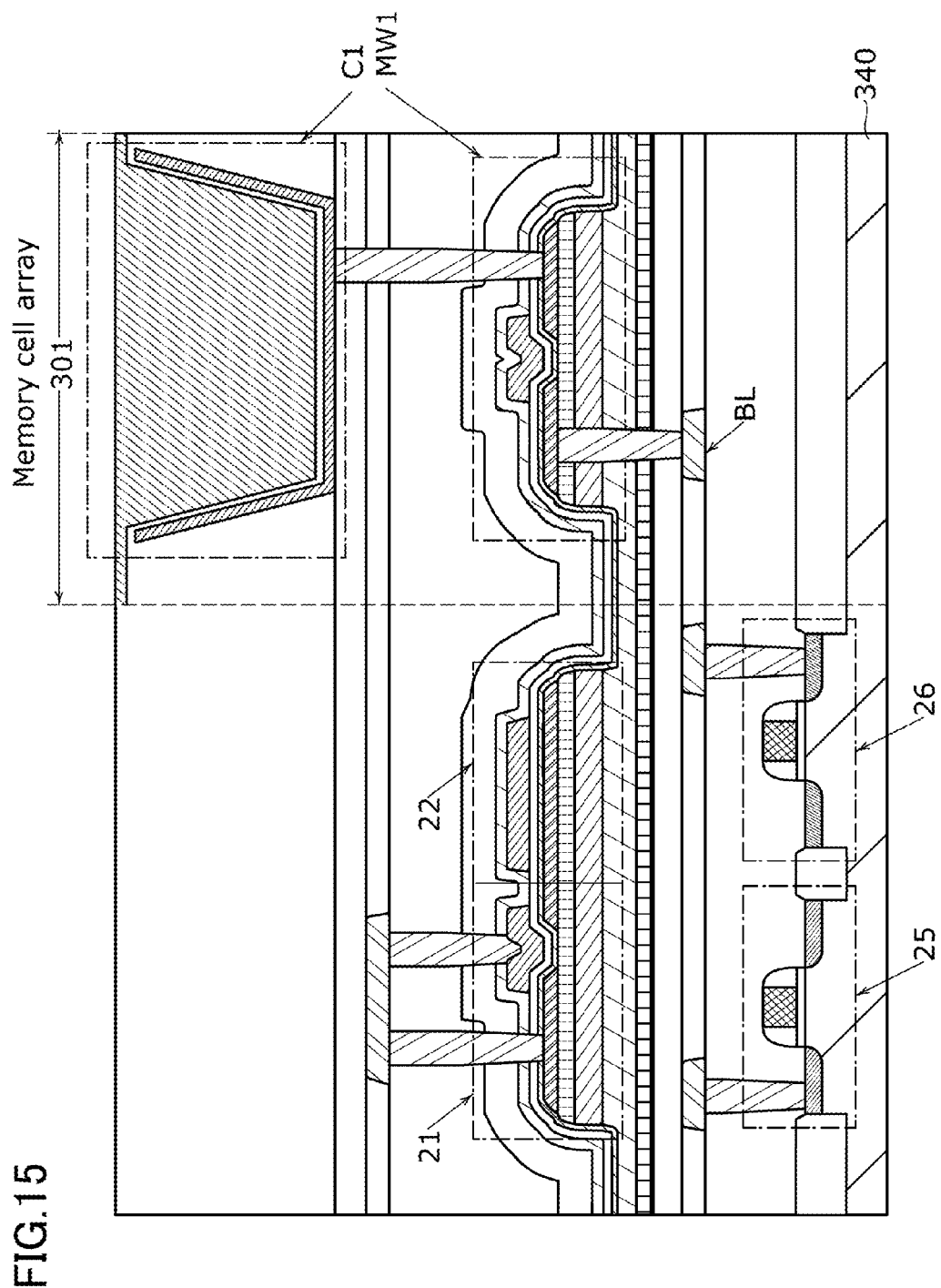
FIG. 15 is a cross-sectional view illustrating a structure example of a memory device.

In FIG. 15, as a circuit including Si transistors, transistors 25 and 26 are particularly shown. The transistor 25 is an n-channel transistor, and the transistor 26 is a p-channel transistor. FIG. 15 shows an example in which a conductive layer used for the wiring BL is provided in wiring layers of Si transistors.

The transistors 25 and 26 have a planar shape. The device structures of the transistors 25 and 26 are not limited to those in FIG. 15. For example, the transistors 25 and 26 may have a three-dimensional structure which is called a fin type or a tri-gate type. Furthermore, an impurity region serving as a lightly doped drain (LDD) region or an extension region may be provided under a sidewall insulating layer. In order to suppress the deterioration due to hot carriers, the LDD region or the extension region is preferably provided in the n-channel transistor 25.

When the OS transistor is stacked over the Si transistor, the chip size of the memory device 300 can be small. In the case where the memory device 300 has a device structure as illustrated in FIG. 15, the memory cell 310 may be a memory element in which the OS transistor and the Si transistor are combined. Configuration examples of such memory cells are illustrated in FIGS. 11B and 11C.

<Memory Cell>

Figure 11B:
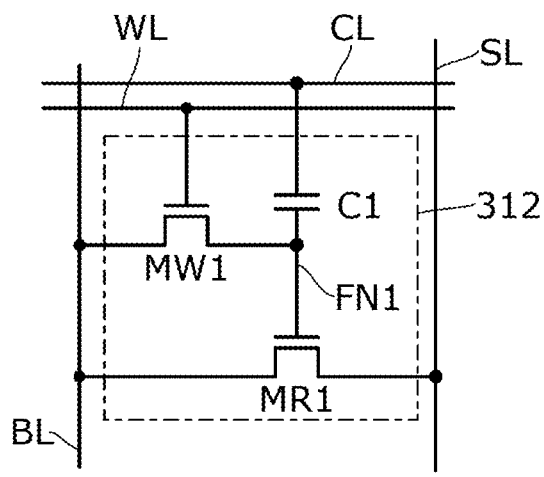

A memory cell 312 illustrated in FIG. 11B is electrically connected to wirings WL, BL, CL, and SL. The memory cell 312 is a 2T1C-type gain cell and includes the node FN1, the transistor MW1, a transistor MR1, and the capacitor C1. The transistor MR1 can be a Si transistor, which may be a p-channel transistor in this case. Furthermore, a reading bit line (a wiring RBL) may be provided to be electrically connected to the transistor MR1.

Figure 11C:
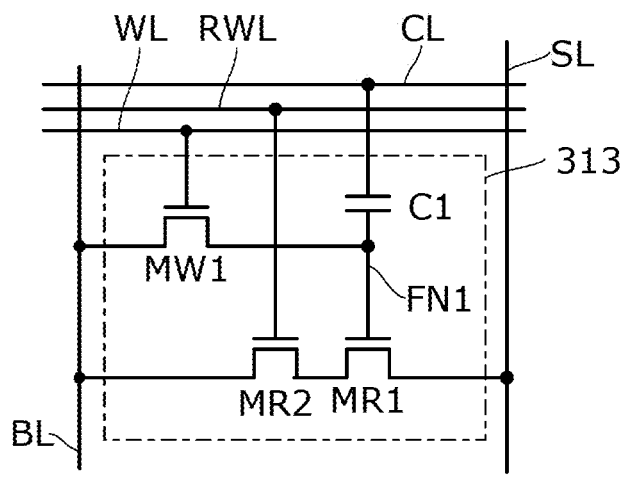

A memory cell 313 illustrated in FIG. 11C is electrically connected to wirings WL, RWL, BL, CL, and SL. The memory cell 313 is a 3T1C-type gain cell. The memory cell 313 includes the node FN1, the transistor MW1, the transistor MR1, a transistor MR2, and the capacitor C1. The transistors MR1 and MR2 can be Si transistors, which may be p-channel transistors in this case. Furthermore, a wiring RBL may be provided to be electrically connected to the transistor MR2.

In the case where the memory cells 312 or the memory cells 313 are included in the memory cell array 301, peripheral circuits may be changed as appropriate in accordance with the circuit configuration and the driving method of the memory cell 312 or 313.

<<Imaging Device>>

Figure 16A:
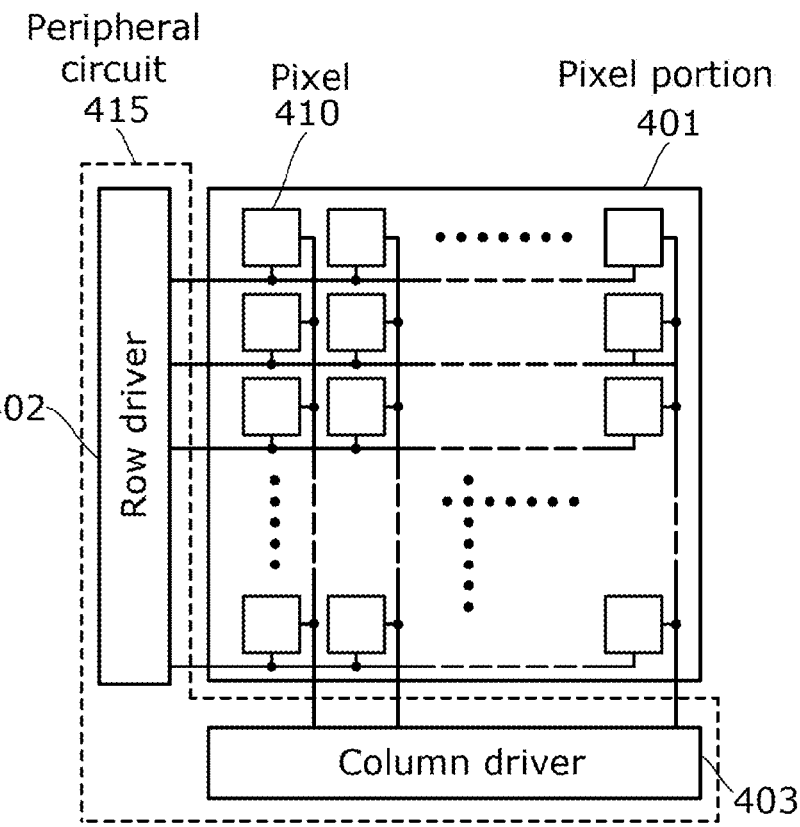
FIG. 16A is a block diagram showing a configuration example of an imaging device.
Figure 16B:
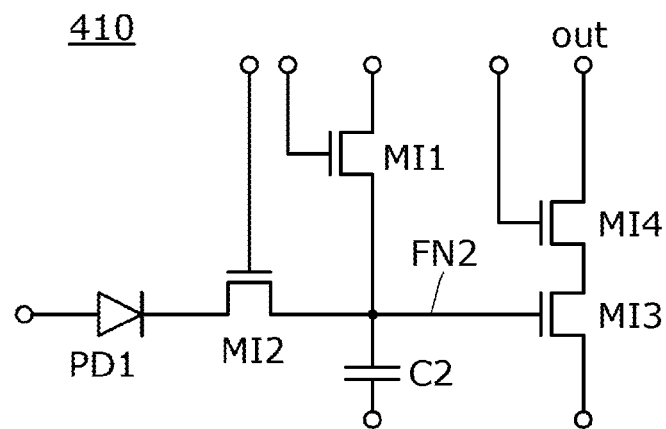
FIG. 16B is a circuit diagram showing a configuration example of a pixel.

FIG. 16A illustrates a configuration example of an imaging device. An imaging device 400 in FIG. 16A includes a pixel portion 401 and a peripheral circuit 415. The peripheral circuit 415 includes a row driver 402 and a column driver 403. The pixel portion 401 includes a plurality of pixels 410 arranged in array. The pixel 410 is an image sensor, and has a function of converting light into electric charge, a function of accumulating electric charge, and the like. FIG. 16B shows an example of the pixel 410.

The pixel 410 in FIG. 16B includes a photodiode PD1, transistors MI1 to MI4, a capacitor C2, and a node FN2. The node FN2 serves as a data holding node. The capacitor C2 is a storage capacitor for holding the voltage of the node FN2. The transistor MI1 is referred to as a reset transistor. The transistor MI1 has a function of resetting the voltage of the node FN2. The transistor MI2 is referred to as an exposure transistor that controls an exposure operation. The transistor MI2 is a pass transistor that controls a conduction state between the node FN2 and the photodiode PD1. With the transistor MI2, the exposure operation timing can be controlled; thus, an image can be taken by a global shutter method. The transistor MI3 is referred to as an amplifier transistor. The transistor MI3 has a function of generating on-state current corresponding to the voltage of the node FN2. The transistor MI4 is referred to as a selection transistor. The transistor MI4 is a pass transistor that controls a conduction state between the transistor MI3 and an output terminal of the pixel 410.

A diode element formed using a silicon substrate with a pn junction or a pin junction can be used as the photodiode PD1. Alternatively, a pin diode element formed using an amorphous silicon film, a microcrystalline silicon film, or the like may be used. Another photoelectric conversion element may be used instead of the photodiode in the pixel 410. For example, a diode-connected transistor may be used. Alternatively, a variable resistor or the like utilizing a photoelectric effect may be formed using silicon, germanium, selenium, or the like. Alternatively, a photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained. Amorphous selenium or crystalline selenium can be used as a selenium-based material. Crystalline selenium may be obtained by, for example, depositing amorphous selenium and then performing heat treatment. When the crystal grain size of crystalline selenium is smaller than a pixel pitch, variation in characteristics between pixels can be reduced.

The row driver 402 has a function of selecting the pixel 410 from which a signal is read out. In the case of the pixel 410 in FIG. 16B, the row driver 402 may generate a signal to be input to a gate of the transistor MI4. The column driver 403 has a function of reading out a signal from the pixel 410 and generating an imaging data signal. The row driver 402 and the column driver 403 can include various logic circuits such as a decoder and a shift register. The decoder may have a circuit configuration similar to that of the row decoder 302 (FIG. 10), for example. Furthermore, as a basic logic element of each of the row driver 402 and the column driver 403, the dynamic logic circuit in Embodiment 1 can be used. The column driver 403 may be provided with a functional circuit that processes a signal read out from the pixel 410. Examples of the functional circuit include an analog-digital converter circuit and a circuit that performs difference processing.

Figure 17:
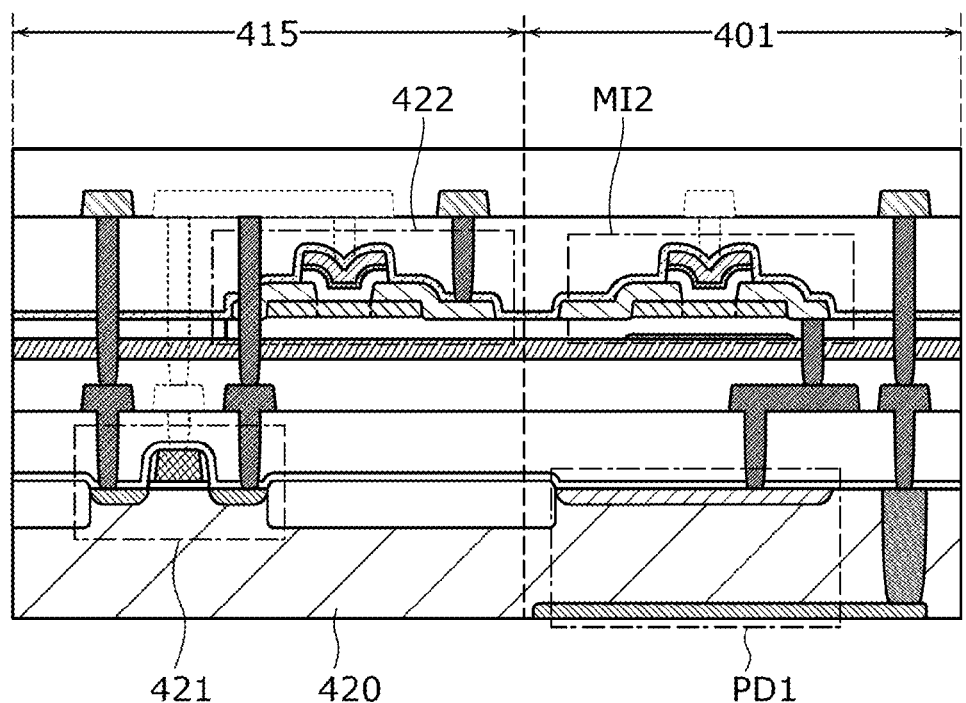
FIG. 17 is a cross-sectional view illustrating a structure example of an imaging device.

OS transistors can be used as the transistors MI1 to MI4 of the pixel 410. In this case, OS transistors may be used in the dynamic logic circuit provided in the row driver 402 and/or the column driver 403 as well as in the pixel portion 401. FIG. 17 shows an example of a structure of the imaging device 400. FIG. 17 shows an example in which an OS transistor and a Si transistor are combined. In the peripheral circuit 415, typically, a Si transistor 421 and an OS transistor 422 are shown. In the pixel portion 401, the photodiode PD1 and the transistor MI2 are particularly shown. The Si transistor 421 and the photodiode PD1 are formed using a semiconductor substrate 420. Since the transistors MI1 to MI4 can be stacked over the photodiode PD1, the integration degree of the pixel portion 401 can be increased.

<<Display Device>>

Figure 18:
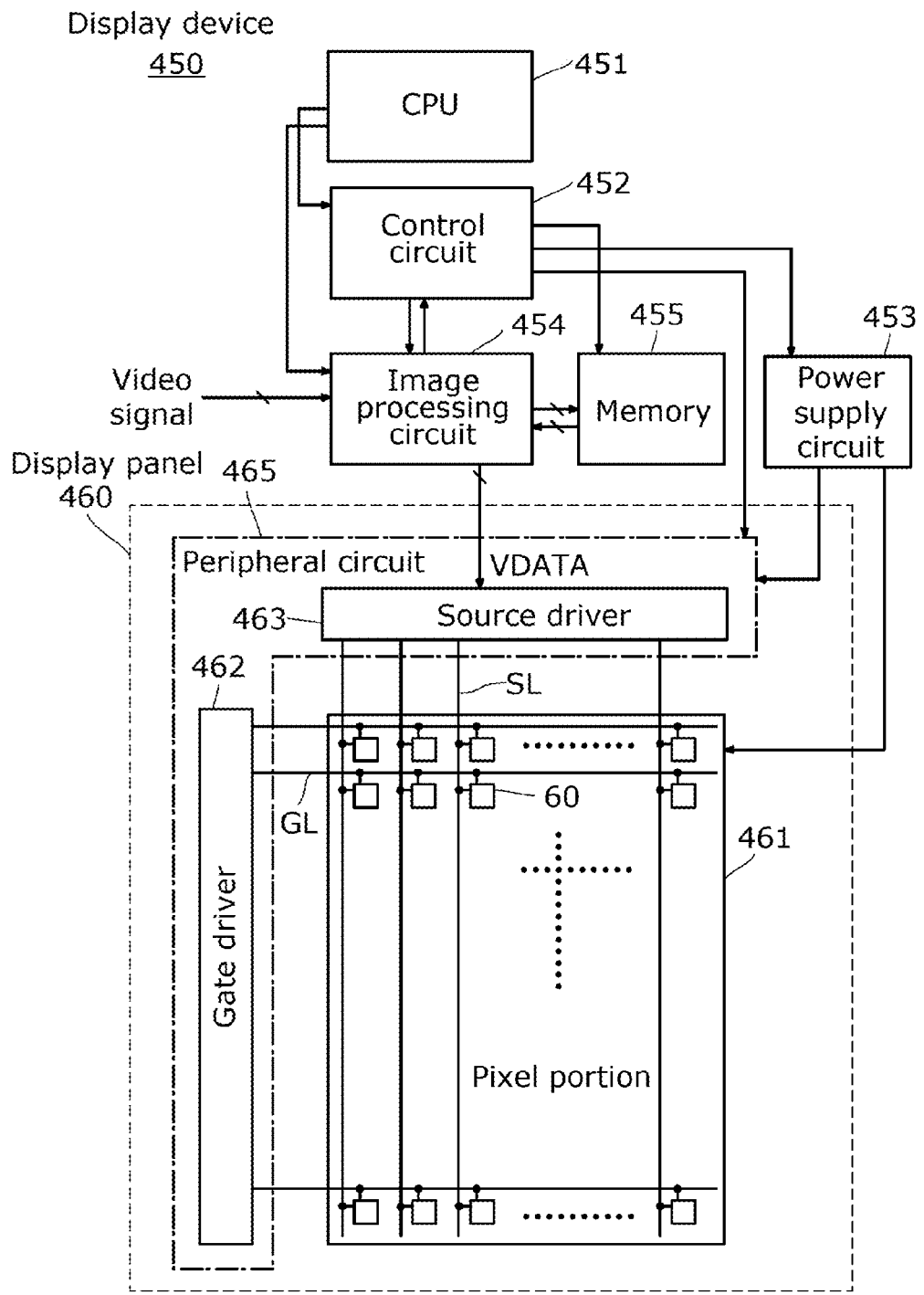
FIG. 18 is a block diagram showing a configuration example of a display device.

FIG. 18 shows a configuration example of the display device. The display device 450 in FIG. 18 includes a CPU 451, a control circuit 452, a power supply circuit 453, an image processing circuit 454, a memory device 455, and a display panel 460. The display panel 460 includes a pixel portion 461 and a peripheral circuit 465. The peripheral circuit 465 includes a gate driver 462 and a source driver 463. The gate driver 462 is a circuit for driving a wiring GL and has a function of generating a signal supplied to the wiring GL. The source driver 463 is a circuit for driving a wiring SL and has a function of generating a signal supplied to the wiring SL.

The CPU 451 is a circuit for executing an instruction and controlling the display device 450 collectively. The CPU 451 executes an instruction input from the outside and an instruction stored in an internal memory. The CPU 451 generates signals for controlling the control circuit 452 and the image processing circuit 454. On the basis of a control signal from the CPU 451, the control circuit 452 controls the operation of the display device 450. The control circuit 452 controls the peripheral circuit 465, the power supply circuit 453, the image processing circuit 454, and the memory device 455 so that the process determined by the CPU 451 is executed. To the control circuit 452, for example, a variety of synchronization signals which determine timing of updating the screen are input. Examples of the synchronization signals include a horizontal synchronization signal, a vertical synchronization signal, and a reference clock signal. The control circuit 452 generates control signals of the peripheral circuit 465 from these signals. The power supply circuit 453 has a function of supplying power supply voltage to the pixel portion 461 and the peripheral circuit 465.

The image processing circuit 454 has a function of processing an image signal input from the outside and generating a data signal VDATA. The source driver 463 has a function of processing the data signal VDATA and generating a data signal supplied to each wiring SL. The memory device 455 is provided to store data needed for performing processing in the image processing circuit 454. The data signal VDATA or a video signal input from the outside is stored in the memory device 455, for example.

Figure 19A:
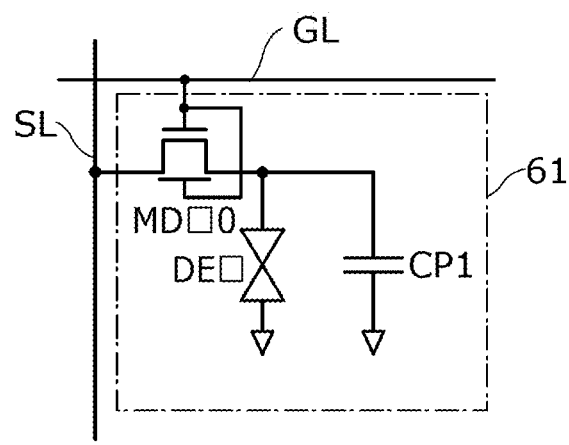
FIGS. 19A and 19B are circuit diagrams each showing a configuration example of a pixel.
Figure 19B:
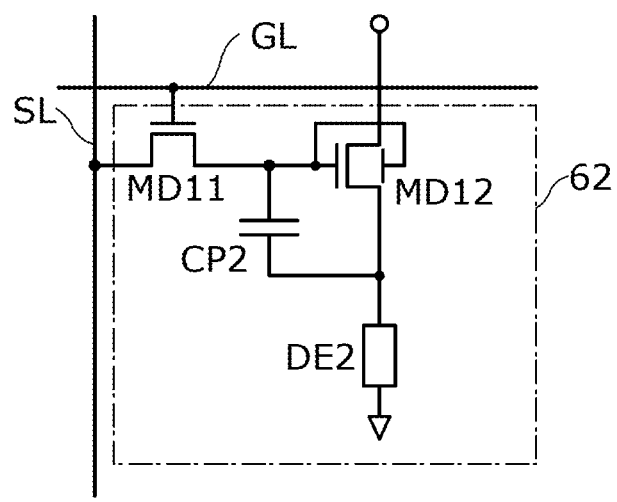

The pixel portion 461 includes a plurality of pixels 60, a plurality of wirings GL, and a plurality of wirings SL. The plurality of pixels 60 are arranged in array. The plurality of wirings GL and SL are provided in accordance with the arrangement of the plurality of pixels 60. The wirings GL are arranged in a vertical direction, and the wirings SL are arranged in a horizontal direction. The wiring GL is also referred to as a gate line, a scan line, a selection signal line, or the like. The wiring SL is also referred to as a source line, a data line, or the like. FIGS. 19A and 19B show configuration examples of the pixel 60.

(Pixel of Liquid Crystal Display Device)

FIG. 19A shows a configuration example of a pixel of the display device 450 which is a liquid crystal display device. A pixel 61 in FIG. 19A includes a transistor MD10, a liquid crystal element DE1, and a capacitor CP1. The liquid crystal element DE1 includes a pixel electrode, a counter electrode, and a liquid crystal layer provided therebetween. The pixel electrode is connected to the transistor MD10. Here, the transistor MD10 is an n-channel transistor. In addition, in the circuit configuration, the transistor MD10 is provided with a back gate, which is electrically connected to a gate of the transistor MD10. This can increase the current drive capability of the transistor MD10. The transistor MD10 is not necessarily provided with the back gate.

For the liquid crystal layer, a liquid crystal material classified into a thermotropic liquid crystal or a lyotropic liquid crystal can be used, for example. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

There is no limitation on a driving mode of the liquid crystal device. A device structure of the pixel portion 461 is determined in accordance with a driving mode. A pixel can be driven in any of the following driving modes: a twisted nematic (TN) mode; a fringe field switching (FFS) mode; a super twisted nematic (STN) mode; a vertical alignment (VA) mode; a multi-domain vertical alignment (MVA) mode; an in-plane-switching (IPS) mode; an optically compensated birefringence (OCB) mode; a blue phase mode; a transverse bend alignment (TBA) mode; a VA-IPS mode; an electrically controlled birefringence (ECB) mode; a ferroelectric liquid crystal (FLC) mode; an anti-ferroelectric liquid crystal (AFLC) mode; a polymer dispersed liquid crystal (PDLC) mode; a polymer network liquid crystal (PNLC) mode; a guest-host mode; an advanced super view (ASV) mode; and the like.

In the pixel 61 in FIG. 19A, when the liquid crystal element DE1 is replaced with a display element that controls a gray level by an electronic ink method, an electronic liquid powder (registered trademark) method, or the like, the display device 450 can be used as electronic paper.

(Pixel of EL Display Device)

FIG. 19B shows a configuration example of a pixel of the display device 450 which is an EL display device. A pixel 62 in FIG. 19B includes transistors MD 11 and MD 12, an EL element DE 2, and a capacitor CP 2. Here, the transistors MD 11 and MD 12 are n-channel transistors. The transistor MD 11 is a pass transistor that controls a conduction state between a gate of the transistor MD 12 and the wiring SL, and is referred to as a selection transistor. The transistor MD 12 is referred to as a driving transistor, and serves as a source that supplies current or voltage to the EL element DE 2. Here, in order to improve the current drive capability, the transistor MD 12 is provided with a back gate. The transistor MD 11 may also be provided with a back gate electrically connected to a gate electrode. The capacitor CP 2 is a storage capacitor for holding the gate potential of the transistor MD 12.

The EL element DE 2 is a light-emitting element including an anode, a cathode, and a light-emitting layer provided therebetween. One of the anode and the cathode serves as a pixel electrode, and the pixel electrode is electrically connected to the transistor MD 12. The light-emitting layer of the EL element DE 2 contains at least a light-emitting substance. Examples of the light-emitting substance include organic EL materials, inorganic EL materials, and the like. Light emission from the light-emitting layer includes light emission (fluorescence) which is generated in returning from a singlet excited state to a ground state and light emission (phosphorescence) which is generated in returning from a triplet excited state to a ground state.

Note that the circuit configuration of a pixel is not limited to those in FIGS. 19A and 19B. For example, a switch, a resistor, a capacitor, a sensor, a transistor, a logic circuit, or the like may be added to the pixel 61 in FIG. 19A. The same applies to the pixel 62 in FIG. 19B.

Here, the liquid crystal display device and the EL display device are shown as specific examples of the pixel; however, this embodiment is not limited thereto. Examples of the display element include a transistor (a transistor which emits light depending on current), an electron emitter, electronic ink, an electrophoretic element, a grating light valve (GLV), a display element including micro electro mechanical systems (MEMS), a digital micromirror device (DMD), a digital micro shutter (DMS), an interferometric modulator display element (IMOD), a MEMS shutter display element, an optical interference type MEMS display element, an electrowetting element, a piezoelectric ceramic element (e.g., a piezoelectric actuator), and a field emission element (e.g., a carbon nanotube).

<Display Panel>

FIG. 20 is an exploded perspective view of the display device 450. The display device 450 includes, between an upper cover 471 and a lower cover 472, a touch panel unit 473, a display panel 460, a backlight unit 474, a frame 476, a printed board 477, and a battery 478. The shapes and sizes of the upper cover 471 and the lower cover 472 can be changed as appropriate in accordance with the sizes of the touch panel unit 473 and the display panel 460. The frame 476 protects the display panel 460 and the touch panel unit 473 and also functions as an electromagnetic shield for blocking electromagnetic waves generated by the operation of the printed board 477. The frame 476 may function as a radiator plate.

An FPC 480 and an FPC 481 are electrically connected to the touch panel unit 473 and the display panel 460, respectively. The backlight unit 474 includes a light source 475. In FIG. 20, a plurality of light sources 475 are two-dimensionally arranged; however, the arrangement of the light sources 475 is not limited thereto. For example, a structure in which a light source 475 is provided at an end portion of the backlight unit 474 and a light diffusion plate is further provided may be employed. Note that the touch panel unit 473, the backlight unit 474, the battery 478, and the like are not provided in some cases.

The printed board 477 includes the CPU 451, the power supply circuit 453, the image processing circuit 454, and the memory device 455. As a power source for supplying electric power to the power supply circuit 453, an external commercial power source or a power source using the battery 478 separately provided may be used. The battery 478 can be omitted in the case of using a commercial power source. The display device 450 may be additionally provided with a member such as a polarizing plate, a retardation plate, or a prism sheet. As the memory device 455 or a memory device in the CPU 451, the memory device 300 in FIG. 10 can be used.

The touch panel unit 473 can be a resistive touch panel or a capacitive touch panel and can be formed to overlap with the display panel 460. A counter substrate (sealing substrate) of the display panel 460 can have a touch panel function. A photosensor may be provided in each pixel of the display panel 460 to form an optical touch panel. An electrode for a touch sensor may be provided in each pixel of the display panel 460 so that a capacitive touch panel is obtained.

The display panel 460 in FIG. 20 includes a substrate 485 and a substrate (counter substrate) 486. The substrate 485 is provided with the pixel portion 461 and the peripheral circuit 465. The substrate 485 provided with a circuit such as the pixel portion 461 is referred to as an element substrate (backplane) in some cases. Part or all of the peripheral circuit 465 may be provided for the substrate 485 in the same manufacturing process as the pixel portion 461. In the example shown in FIG. 20, part of the peripheral circuit 465 is provided in an IC 483. The IC 483 is mounted on the substrate 485 by a chip on glass (COG) method.

<Display Panel>

Figure 21A:
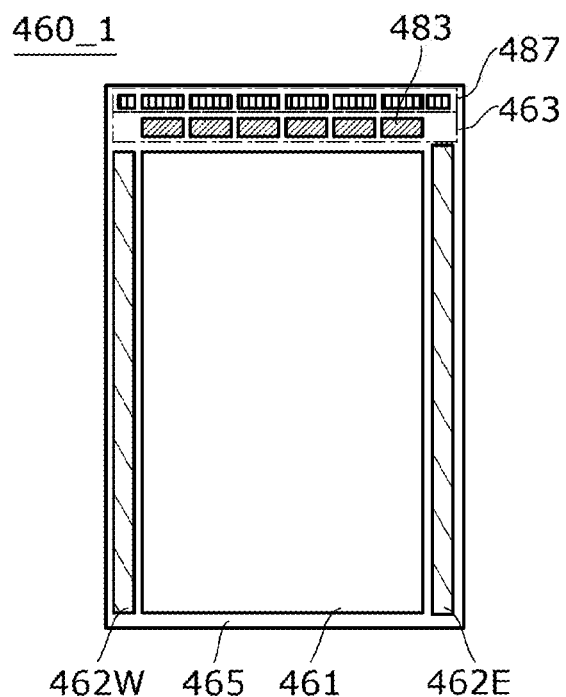
FIGS. 21A and 21B are plan views each illustrating a structure example of an element substrate of a display panel.
Figure 21B:
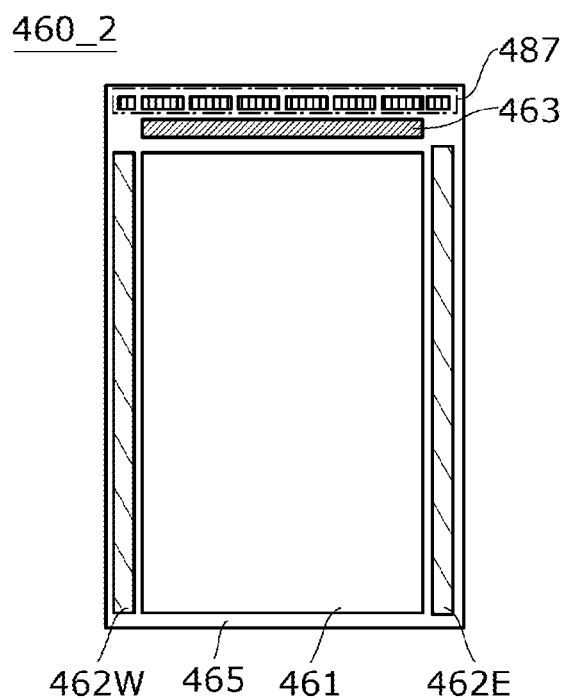

FIGS. 21A and 21B are plan views illustrating structure examples of an element substrate of the display panel 460. In the case where the pixel portion 461 includes transistors of the same conductivity type, part of the peripheral circuit 465 that includes transistors of the same conductivity type may be provided over the substrate 485 together with the pixel portion 461.

In a display panel 460_1 illustrated in FIG. 21A, the gate driver 462 is formed over the substrate 485 in the same process as the pixel portion 461, and the source driver 463 includes the plurality of ICs 483. A terminal portion 487 includes extraction terminals of the FPC 481, the pixel portion 461, and the peripheral circuit 465. The FPC 481 is electrically connected to the terminal portion 487. In a display panel 460_2 illustrated in FIG. 21B, the source driver 463 is also formed over the substrate 485 in the same process as the pixel portion 461.

The gate driver 462 is divided into two circuits 462E and 462W, and these circuits are provided on the left and right of the pixel portion 461. For example, the wirings GL in the odd-numbered rows are electrically connected to the circuit 462E, and the wirings GL in the even-numbered rows are electrically connected to the circuit 462W. In this case, the circuits 462E and 462W drive the wirings GL alternately. The gate driver 462 can have a circuit configuration similar to that of the raw decoder in FIG. 12. Accordingly, power for driving the pixel portion 461 including OS transistors having a high threshold voltage can be reduced. In addition, the gate driver 462 can be reduced in size; thus, the display panel 460 having a narrow frame can be provided. Thus, an electronic device incorporating the display device 450 can be reduced in power consumption, size, and weight.

<Device Structure>

Figure 22A:
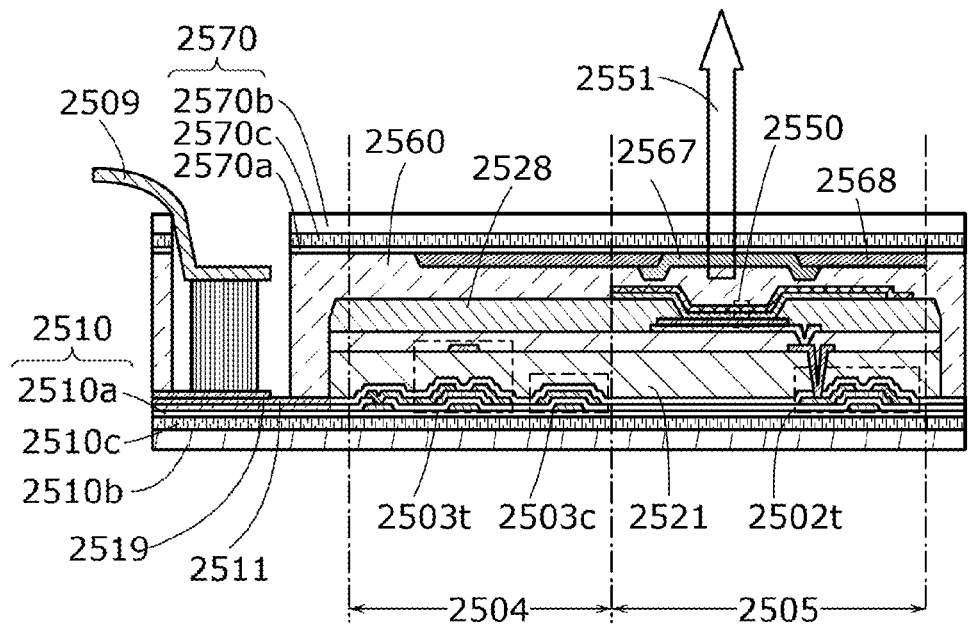
FIGS. 22A and 22B are cross-sectional views each illustrating a device structure example of a display device.
Figure 22B:
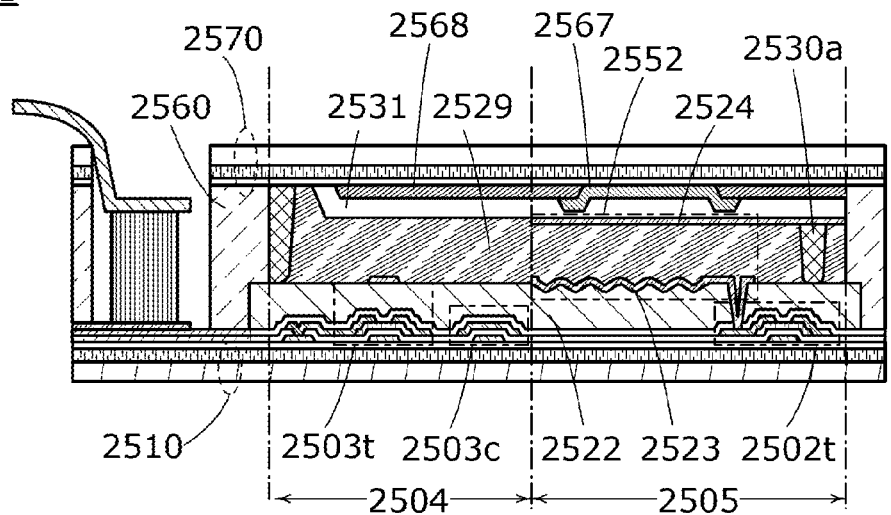

FIG. 22A shows a device structure example of a display panel of an EL display device, and FIG. 22B shows a device structure example of a display panel of a liquid crystal display device. Note that FIGS. 22A and 22B each are not a diagram of the display panel taken along a specific line but a cross-sectional view for illustrating a layered structure of the display panel and a connection structure of elements.

(EL Display Device)

A display panel 2500 shown in FIG. 22A includes a pixel portion 2505 and a gate driver 2504. The pixel portion 2505 includes a transistor 2502t, an EL element 2550, a coloring layer 2567, and a light-blocking layer 2568. The EL element 2550 includes a lower electrode, an upper electrode, and an EL layer between the lower electrode and the upper electrode. Light 2551 emitted from the EL element 2550 is extracted to the outside through the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display panel 2500. The insulating layer 2521 covers the transistor 2502t and the like. The insulating layer 2521 covers unevenness caused by the transistor 2502t and the like to provide a flat surface. The insulating layer 2521 may serve also as a layer for preventing diffusion of impurities. This can prevent a reduction in the reliability of the transistor 2502t or the like due to diffusion of impurities. The EL element 2550 is formed above the insulating layer 2521. A partition 2528 is provided so as to cover end portions of the lower electrode in the EL element 2550. Note that a spacer for controlling the distance between the substrate 2510 and the substrate 2570 may be provided over the partition 2528.

The gate driver 2504 includes a transistor 2503t and a capacitor 2503c. The gate driver 2504 is covered with the light-blocking layer 2568. The transistors 2502t and 2503t may be OS transistors. Over the substrate 2510, the wirings 2511 through which a signal can be supplied are provided. Over the wirings 2511, a terminal 2519 is provided. The FPC 2509 is electrically connected to the terminal 2519.

A substrate 2510 is a stack including an insulating layer 2510a, a flexible substrate 2510b, and an adhesive layer 2510c. Here, the substrate 2510 is not a support substrate used to form the pixel portion 2505 and the like. After the pixel portion 2505 and the like are formed, a support substrate is separated from the insulating layer 2510a, and then the flexible substrate 2510b is bonded to the insulating layer 2510a with the adhesive layer 2510c. The insulating layer 2510a is a blocking layer for preventing diffusion of impurities to the EL element 2550.

A substrate 2570 is a stack including an insulating layer 2570a, a flexible substrate 2570b, and an adhesive layer 2570c. Here, the substrate 2570 is not a support substrate used to form the coloring layer 2567 and the like. After the coloring layer 2567 and the like are formed, a support substrate is separated from the insulating layer 2570a, and then the flexible substrate 2570b is bonded to the insulating layer 2570a with the adhesive layer 2570c. The insulating layer 2570a is a blocking layer for preventing diffusion of impurities to the EL element 2750.

A sealing layer 2560 is provided between the substrate 2510 and the substrate 2570. The sealing layer 2560 preferably has a higher refractive index than the air. A sealant may be formed in the peripheral portion of the sealing layer 2560. With the use of the sealant, the EL element 2550 can be provided in a region surrounded by the substrate 2510, the substrate 2570, the sealing layer 2560, and the sealant. An inert gas (such as nitrogen or argon) may be filled between the substrate 2510 and the substrate 2570. In this case, a drying agent may be provided between the substrate 2510 and the substrate 2570 to adsorb moisture and the like. In the case where the sealing layer 2560 is provided on the light 2551 extraction side, the sealing layer 2560 is in contact with the EL element 2550 and the coloring layer 2567.

(Liquid Crystal Display Device)

Here, differences between the display panel 2501 illustrated in FIG. 22B and the display panel 2500 are described. The pixel portion 2505 includes a liquid crystal element 2552 and the transistor 2502t. The liquid crystal element 2552 includes a pixel electrode 2523, a counter electrode 2524, and a liquid crystal layer 2529. Furthermore, an alignment film for aligning liquid crystal is provided as needed. A spacer 2530a is provided on the substrate 2570. The spacer 2530a is provided to control a distance (a cell gap) between the substrate 2510 and the substrate 2570. The spacer 2530a may be provided on the substrate 2510. The spacer 2530a is formed using a photosensitive resin material, for example.

The counter electrode 2524 of the liquid crystal element 2552 is provided on the substrate 2570 side. An insulating layer 2531 is provided between the counter electrode 2524 and each of the coloring layer 2567 and the light-blocking layer 2568. The pixel electrode 2523 is a reflective electrode. Projections and depressions are formed on a surface of the insulating layer 2522 in a region where the pixel electrode 2523 is formed. Accordingly, a surface of the pixel electrode 2523 has projections and depressions, and light is easily irregularly reflected at the pixel electrode 2523. Thus, the visibility of the display panel 2501 is improved. Note that in the case where the pixel electrode 2523 is a transparent electrode, a structure where the insulating layer 2522 does not have projections and depressions is employed.

(Embodiment 3)

In this embodiment, a processing unit including a logic circuit, a memory device, and the like is described as an example of a semiconductor device. In addition, examples in which a semiconductor device is used in an electronic component, examples in which a semiconductor device is used in an electronic device including the electronic component, and electronic devices including a display device and the like are described, for example.

<<CPU>>

Figure 23:
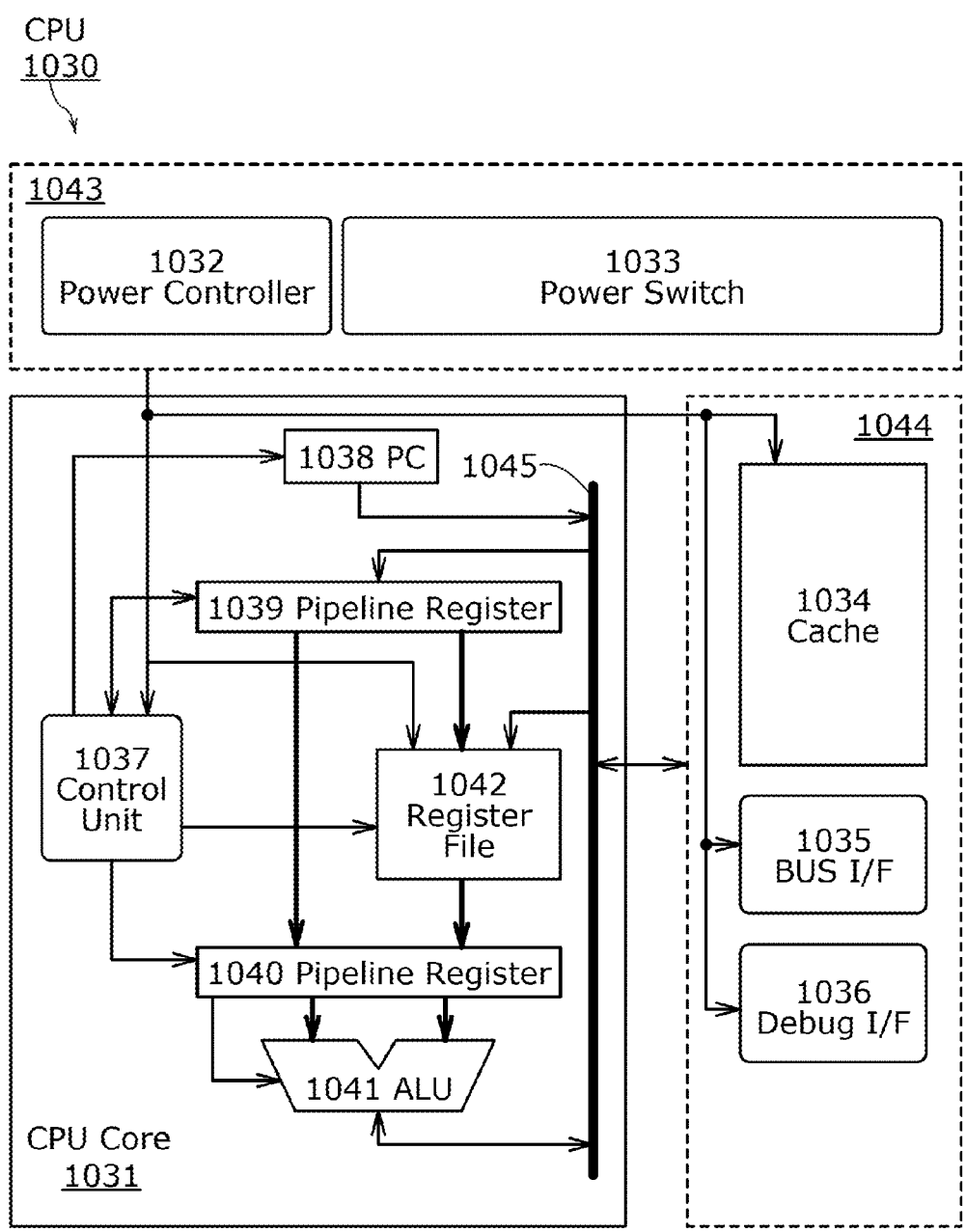
FIG. 23 is a block diagram showing a CPU configuration example.

FIG. 23 illustrates a CPU configuration example. A CPU 1030 illustrated in FIG. 23 includes a CPU core 1031, a power management unit 1043, and a peripheral circuit 1044. The power management unit 1043 includes a power controller 1032 and a power switch 1033. The peripheral circuit 1044 includes a cache 1034 including cache memory, a bus interface (BUS I/F) 1035, and a debug interface (Debug I/F) 1036. The CPU core 1031 includes a data bus 1045, a control unit 1037, a program counter (PC) 1038, a pipeline register 1039, a pipeline register 1040, an arithmetic logic unit (ALU) 1041, and a register file 1042. Data is transmitted between the CPU core 1031 and the peripheral circuit 1044 such as the cache 1034 via the data bus 1045.

The control unit 1037 has functions of decoding and executing instructions contained in a program such as inputted applications by controlling the overall operations of the PC 1038, the pipeline registers 1039 and 1040, the ALU 1041, the register file 1042, the cache 1034, the bus interface 1035, the debug interface 1036, and the power controller 1032. The ALU 1041 has a function of performing a variety of arithmetic operations such as four arithmetic operations and logic operations.

The cache 1034 has a function of temporarily storing frequently used data. The PC 1038 is a register having a function of storing an address of an instruction to be executed next. Although not illustrated in FIG. 23, the cache 1034 includes a cache controller for controlling the operation of the cache memory. The pipeline register 1039 has a function of temporarily storing instruction data. The pipeline register 1040 has a function of temporarily storing data used for arithmetic operations performed in the ALU 1041, data obtained as a result of arithmetic operations in the ALU 1041, or the like. The register file 1042 includes a plurality of registers including a general purpose register and can store data that is read from the main memory, data obtained as a result of arithmetic operations in the ALU 1041, or the like.

The memory device in Embodiment 2 can be used in the cache 1034. Consequently, high-speed operation and low power consumption of the cache 1034 can be achieved and thus a semiconductor device that operates more rapidly or a semiconductor device with low power consumption can be provided.

The bus interface 1035 functions as a path for data between the CPU 1030 and devices outside the CPU 1030. The debug interface 1036 functions as a path of a signal for inputting an instruction to control debugging to the CPU 1030.

The power switch 1033 has a function of controlling supply of the power supply voltage to circuits other than the power controller 1032. These circuits belong to several different power domains. The power switch 1033 controls whether the power is supplied to circuits in the same power domain. The power controller 1032 has a function of controlling the operation of the power switch 1033. With such a configuration, the CPU 1030 can perform power gating. An example of the flow of the power gating operation will be described.

First, the CPU core 1031 sets the timing for stopping the supply of the power in a register of the power controller 1032. Next, an instruction to start power gating is sent from the CPU core 1031 to the power controller 1032. Then, the registers and the cache 1034 in the CPU 1030 start data storing. Subsequently, the power switch 1033 stops the supply of the power supply voltage to the circuits other than the power controller 1032. Then, an interrupt signal is input to the power controller 1032, thereby starting the supply of the power to the circuits in the CPU 1030. Note that a counter may be provided in the power controller 1032 to be used to determine the timing of starting the supply of the power supply voltage regardless of input of an interrupt signal. Next, the registers and the cache 1034 start data restoration. After that, execution of an instruction is resumed in the control unit 1037.

This power gating can be performed in the entire processor or one or more logic circuits included in the processor. The supply of power can be stopped even for a short time. Accordingly, power consumption can be reduced at a fine granularity in space or time.

In the case where the memory device of one embodiment of the present invention is used in the cache 1034, the cache 1034 can retain data for a certain period even when the supply of a power supply voltage is stopped. Therefore, when power gating is performed, a period during which data of the cache 1034 is stored can be secured easily. Even when the supply of the power supply voltage is suddenly stopped, data in the cache 1034 can be stored. In the case where data is stored, the time and power necessary for storing and restoring data is required, while in the case of using the memory device of one embodiment of the present invention, such time and power are not required.

<RFIC>

A radio frequency integrated circuit (RFIC) is described as an example of a processing unit. The RFIC stores necessary data in a memory circuit in the RFIC, and transmits and receives data to/from the outside by using contactless means, for example, wireless communication. With these features, the RFIC is used for an individual authentication system in which an object or the like is recognized by reading the individual information, for example.

Figure 24:
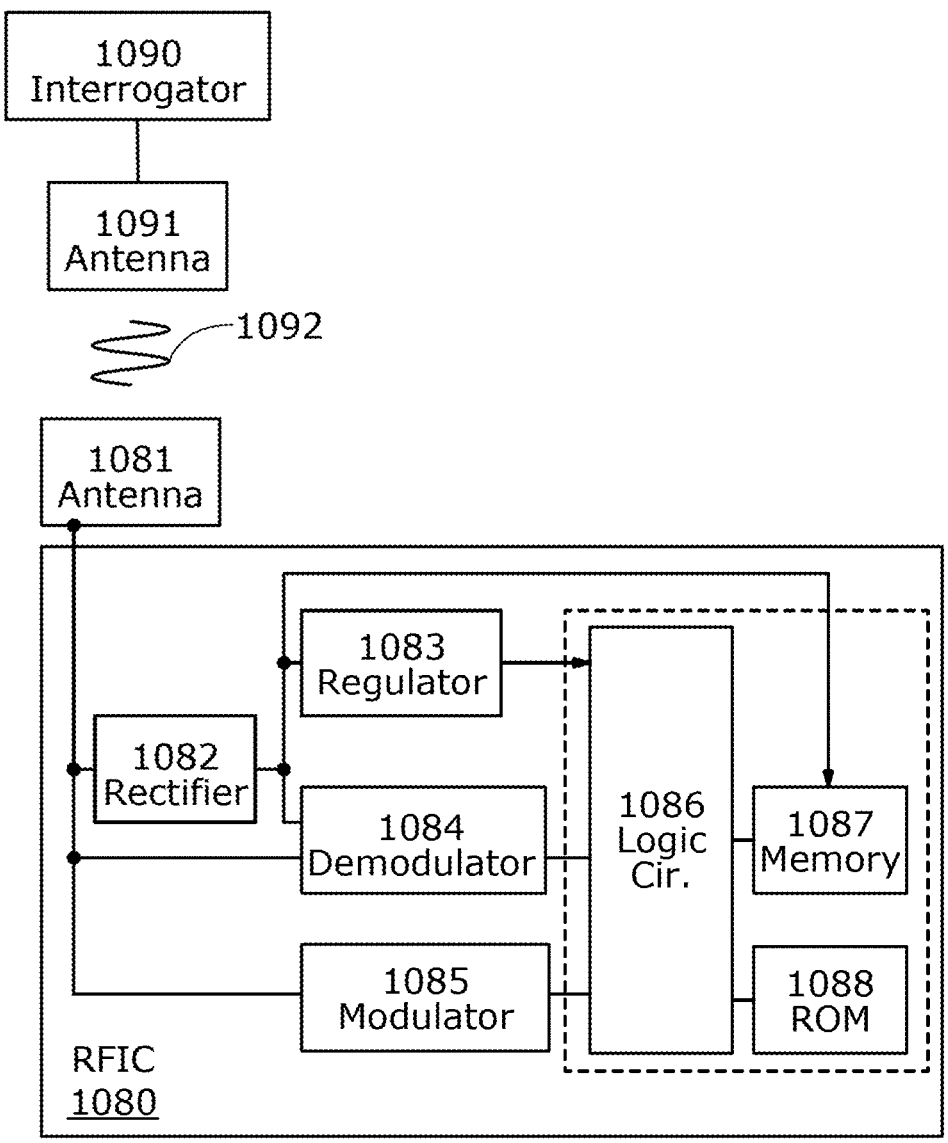
FIG. 24 is a block diagram showing an RFIC configuration example.

FIG. 24 is a block diagram illustrating an example of an RFIC. An RFIC 1080 illustrated in FIG. 24 includes a rectifier circuit 1082, a regulator circuit 1083, a demodulator circuit 1084, a modulator circuit 1085, a logic circuit 1086, a memory device 1087, and a read-only memory (ROM) 1088. Note that decision whether each of these circuits is provided or not can be made as appropriate as needed. Although the RFIC 1080 in the example of FIG. 24 is a passive type, it is needless to say that the RFIC 1080 can be an active type with a built-in battery. An antenna 1081 is electrically connected to the RFIC 1080. A circuit where the antenna 1081 is connected can be referred to as an RFIC.

The memory device in Embodiment 2 has a device structure capable of employing a combined memory (see FIG. 15). Therefore, in the RFIC 1080, circuits other than the antenna 1081 can be incorporated in one chip without complicating the manufacturing process. The antenna 1081 whose performance corresponds to the communication zone is mounted on the chip. Note that as data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC 1080 described in this embodiment.

The antenna 1081 exchanges a radio signal 1092 with an antenna 1091 which is connected to a communication device 1090. The rectifier circuit 1082 generates an input potential by rectification, for example, half-wave voltage doubler rectification of an input alternating signal generated by reception of a radio signal at the antenna 1081 and smoothing of the rectified signal with a capacitor provided in a subsequent stage in the rectifier circuit 1082. Note that a limiter circuit may be provided on an input side or an output side of the rectifier circuit 1082. The limiter circuit controls electric power so that electric power which is higher than or equal to a certain value is not input to a circuit in a subsequent stage if the amplitude of the input alternating signal is high and an internal generation voltage is high.

The logic circuit 1086 decodes and processes the demodulated signal. The memory device 1087 holds the input data and includes a row decoder, a column decoder, a memory region, and the like. Furthermore, the ROM 1088 stores an identification number (ID) or the like and outputs it in accordance with processing.

The regulator circuit 1083 generates a stable power supply voltage from an input potential and supplies it to each circuit. Note that the regulator circuit 1083 may include a reset signal generation circuit. The reset signal generation circuit is a circuit which generates a reset signal of the logic circuit 1086 by utilizing rise of the stable power supply voltage. The demodulation circuit 1084 demodulates the input alternating signal by envelope detection and generates the demodulated signal. The modulation circuit 1085 performs modulation in accordance with data to be output from the antenna 1081.

A variety of kinds of information can be obtained wirelessly by incorporating a sensor unit in the RFIC 1080. The RFIC 1080 including a temperature sensor circuit and/or a humidity sensor circuit can be used for controlling temperature and/or humidity of the cultural properties, for example.

Furthermore, the RFIC is used by being attached to a medical tool for the management thereof. Since medical tools need to be subjected to high-temperature sterilizing treatment at 100° C. or higher in an autoclave, the memory device of the RFIC is required to have high reliability in a high-temperature environment. If the memory device 300 of Embodiment 2 is used as the memory device 1087, even after being exposed to a high-temperature environment at 100° C. or higher, the memory device 1087 can hold data. Thus, the RFIC 1080 is very suitable for medical uses.

Although the CPU and the RFIC are described here as examples of a processing unit, the semiconductor memory device of one embodiment of the present invention can be used for a variety of processing units. For example, the semiconductor memory device of one embodiment of the present invention can also be used for a graphics processing unit (GPU), a programmable logic device (PLD), a digital signal processor (DSP), a microcontroller unit (MCU), and a custom LSI.

<<Manufacturing Method Example of Electronic Component>>

Figure 25A:
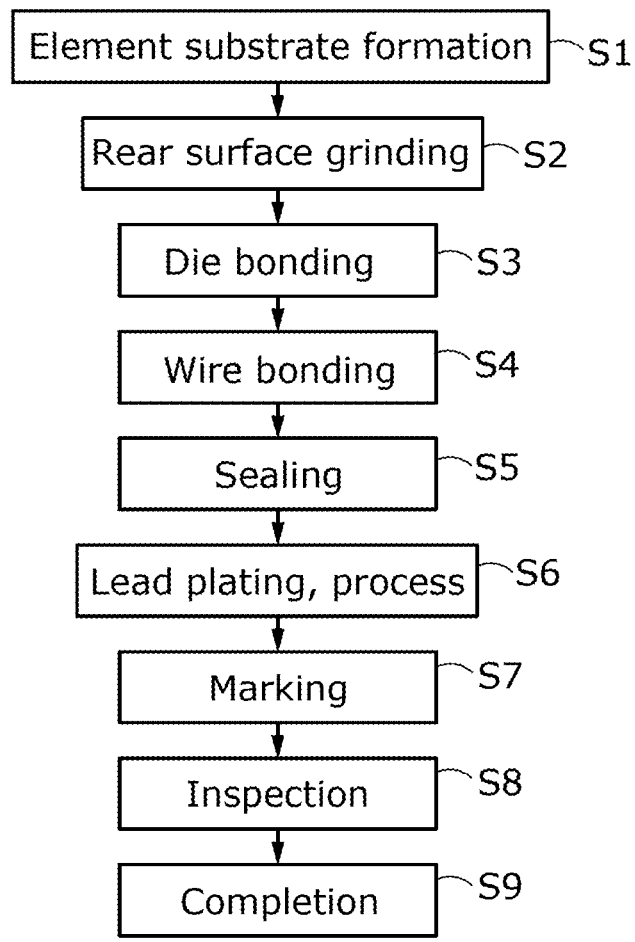
FIG. 25A is a flowchart showing a manufacturing method example of an electronic component.

FIG. 25A is a flow chart showing an example of a method for manufacturing an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be finished through each step in FIG. 25A. Specifically, an element substrate obtained in the preceding process is formed (Step S1). The memory device 300 in FIG. 10, the imaging device 400 in FIG. 16A, and the semiconductor devices in FIG. 23, FIG. 24, and the like are provided for the element substrate, for example.

After an element substrate is completed, a rear surface of the substrate is ground (Step S2). By thinning the substrate at this stage, the warpage or the like of the substrate in the preceding process is reduced and the component is downsized. The rear surface of the substrate is ground so that the substrate is divided into a plurality of chips in a dicing process. Then, the divided chips are separately picked up to be mounted on and bonded to a lead frame in a die bonding process (Step S3). In this die bonding process, the chip is bonded to the lead frame by an appropriate method depending on a product, for example, bonding with a resin or a tape.

Note that in the die bonding process, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding. A molding process is performed to seal the wire bonded chip with an epoxy resin or the like (Step S5). Through the molding step, the inside of the electronic component is filled with a resin, so that the destruction of the circuit portion and the wire embedded in the component due to external mechanical force can be reduced and degradation of characteristics due to moisture or dust can be reduced. Next, plate processing is performed on the lead of the lead frame. After that, the lead is cut and processed (Step S6). This plate processing prevents rust of the lead and facilitates soldering at the time of mounting the chip on a printed wiring board in a later step. Next, printing (marking) is performed on a surface of the package (Step S7). Through the final inspection process (Step S8), the electronic component is completed (Step S9).

The above electronic component can include the semiconductor device described in the above embodiment. Thus, the electronic component can consume less power and have smaller size.

Figure 25B:
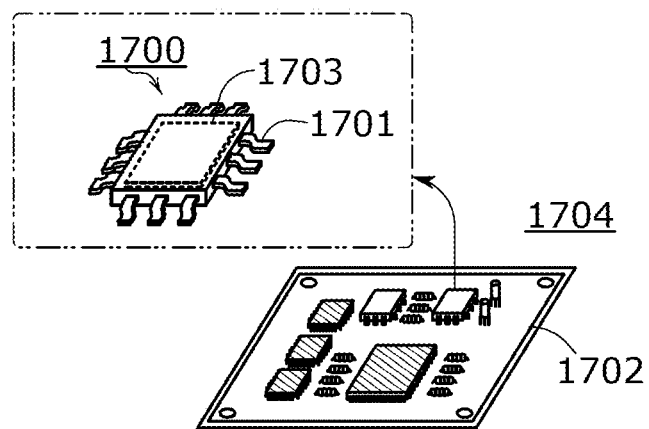
FIG. 25B is a schematic perspective view showing a structure example of an electronic component.

FIG. 25B is a schematic perspective view of the completed electronic component. FIG. 25B shows an example of a quad flat package (QFP). As illustrated in FIG. 25B, an electronic component 1700 includes a lead 1701 and a circuit portion 1703. The electronic component 1700 is mounted on a printed board 1702, for example. When a plurality of electronic components 1700 are used in combination and electrically connected to each other over the printed board 1702, the electronic components 1700 can be provided in an electronic device. A completed circuit board 1704 is provided in the electronic device or the like. For example, the electronic component 1700 can be used as a memory device, an imaging device, and a processing unit such as an MCU and an RFIC.

Figure 26:
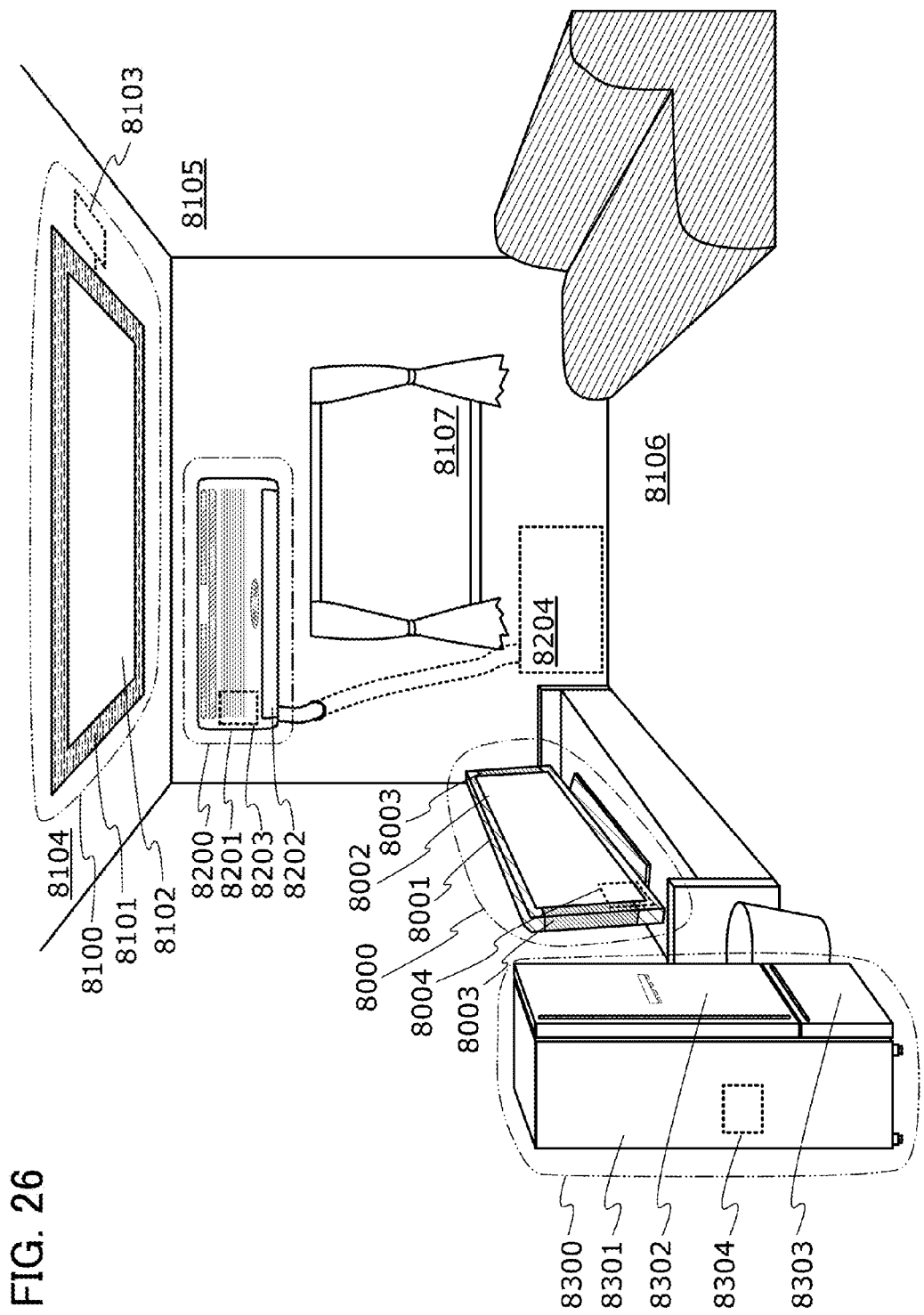
FIG. 26 illustrates examples of electronic devices.

The electronic component 1700 can be used as electronic component (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Specific examples of the electronic devices are illustrated in FIG. 26.

<Electronic Device>

A display device 8000 corresponds to a display device for TV broadcast reception and includes a housing 8001, a display portion 8002, speaker portions 8003, an electronic component 8004, and the like. The electronic component 8004 of one embodiment of the present invention is provided in the housing 8001.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or a field emission display (FED) can be used for the display portion 8002. Note that the display device includes, in its category, all of information display devices for personal computers, advertisement displays, and the like besides TV broadcast reception. Specific examples of other electronic devices which are provided with a display portion, such as the display device 8000, are illustrated in FIGS. 28A to 28F.

A lighting device 8100 is an installation lighting device including a housing 8101, a light source 8102, an electronic component 8103, and the like. As the light source 8102, an artificial light source which emits light artificially by using power can be used. Specifically, an incandescent lamp, a discharge lamp such as a fluorescent lamp, and light-emitting elements such as an LED and an organic EL element are given as examples of the artificial light source. Although FIG. 26 illustrates an example where the lighting device 8100 is provided on a ceiling 8104, the lighting device 8100 may be provided on, for example, a sidewall 8105, a floor 8106, or a window 8107. The lighting device is not limited to an installation lighting device and may be a tabletop lighting device, a portable lighting device, or the like.

An air conditioner including an indoor unit 8200 and an outdoor unit 8204 is an example of an electronic device including an electronic component 8203 of one embodiment of the present invention. The indoor unit 8200 includes a housing 8201, an air outlet 8202, the electronic component 8203, and the like. Although FIG. 26 illustrates the case where the electronic component 8203 is provided in the indoor unit 8200, the electronic component 8203 may be provided in the outdoor unit 8204. Alternatively, the electronic component 8203 may be provided in each of the indoor unit 8200 and the outdoor unit 8204. For example, an infrared light sensor or a temperature sensor unit is incorporated in the electronic component 8203 as a sensor unit. Although FIG. 26 illustrates a separated air conditioner including the indoor unit and the outdoor unit as an example, it may be an air conditioner in which the functions of an indoor unit and an outdoor unit are integrated in one housing.

An electric refrigerator-freezer 8300 includes a housing 8301, a door for a refrigerator 8302, a door for a freezer 8303, an electronic component 8304, and the like. The electronic component 8304 is provided in the housing 8301.

Figure 27A:
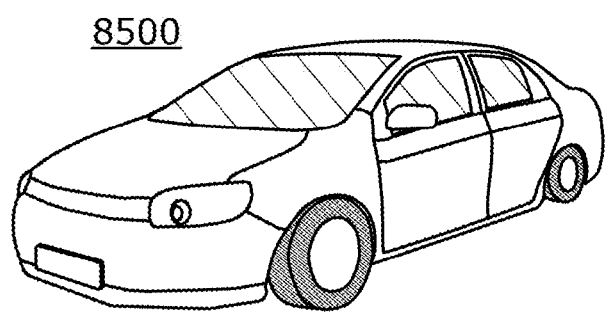
FIGS. 27A and 27B illustrate an example of an electric vehicle.
Figure 27B:
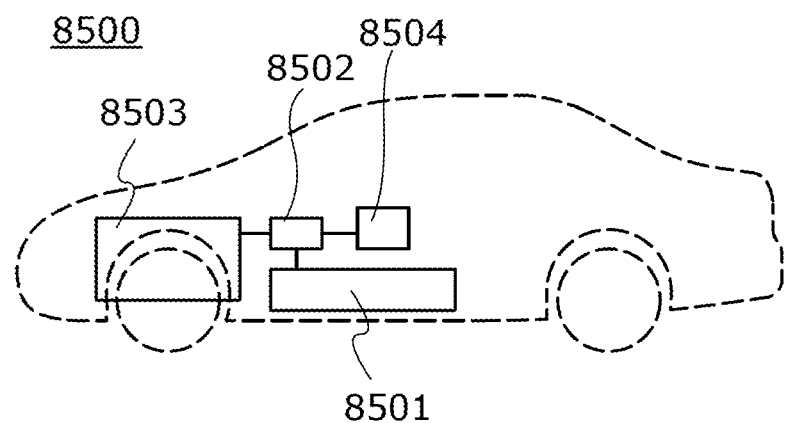

FIG. 26 illustrates examples of household appliances using the electronic component 1700. The electronic component 1700 can be incorporated in a variety of household appliances such as a microwave oven, a dishwasher, a washing machine, or a vacuum cleaner. Electronic devices in which the electronic component 1700 can be incorporated are not limited to household appliances. As described above, the electronic component 1700 can be used in a variety of electronic devices used in, for example, industrial robots, assistive robots, planes, ships, and automobiles. FIGS. 27A and 27B illustrate an example of an electric vehicle as an example of such an electronic device.

<Electric Vehicle>

FIG. 27A is an external view illustrating an example of an electric vehicle 8500. The electric vehicle 8500 is equipped with a lithium-ion secondary battery 8501 as illustrated in FIG. 27B. The output of the electric power of the lithium-ion secondary battery 8501 is adjusted by a control circuit 8502 and the electric power is supplied to a driving device 8503. The control circuit 8502 is controlled by a processing unit 8504. For example, the logic circuit of one embodiment of the present invention can be used for a memory device such as the control circuit 8502 or the processing unit 8504.

The driving device 8503 includes a DC motor or an AC motor either alone or in combination with an internal-combustion engine. The processing unit 8504 outputs a control signal to the control circuit 8502 based on input data such as data on operation (e.g., acceleration, deceleration, or stop) by a driver of the electric vehicle 8500 or data on driving the electric vehicle 8500 (e.g., data on an upgrade or a downgrade, or data on a load on a driving wheel). The control circuit 8502 adjusts the electric energy supplied from the lithium-ion secondary battery 8501 in accordance with the control signal of the processing unit 8504 to control the output of the driving device 8503.

<Electronic Devices including Display Portion>

Electronic devices each including a display portion are given below as examples of semiconductor devices. The examples of the electronic device include television sets, laptop personal computers (PCs), tablet PCs, image reproducing devices (typically, devices which reproduce images recorded in recording media such as DVDs, Blu-ray Discs, and hard disks and have display portions for displaying reproduced images), mobile phones, smartphones, portable game consoles, portable information terminals (e.g., tablet information terminals), wearable (e.g., glasses-type, goggle-type, watch-type, and bangle-type) information terminals, e-book readers, cameras (e.g., video cameras and digital still cameras), navigation systems, audio reproducing devices (e.g., car audio systems and digital audio players), copiers, facsimiles, printers, multifunction printers, automated teller machines (ATM), and vending machines. Specific examples of such electronic devices are shown in FIGS. 28A to 28F.

Figure 28A:
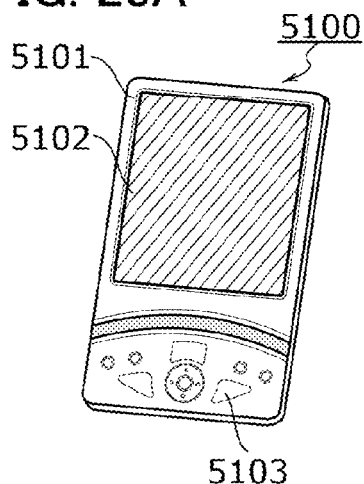
FIGS. 28A to 28F illustrate examples of electronic devices.

An information terminal 5100 illustrated in FIG. 28A includes a housing 5101, a display portion 5102, operation keys 5103, and the like.

Figure 28B:
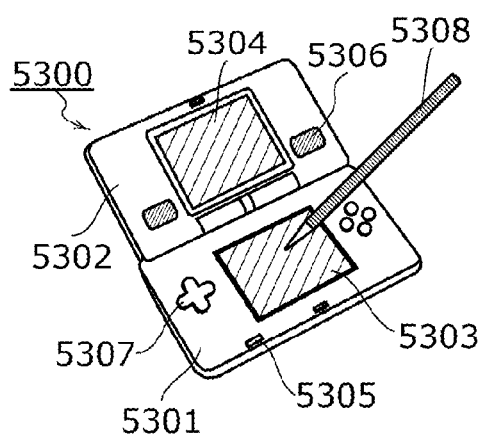

A portable game console 5300 illustrated in FIG. 28B includes a housing 5301, a housing 5302, a display portion 5303, a display portion 5304, a microphone 5305, a speaker 5306, an operation key 5307, a stylus 5308, and the like. Although the portable game console 5300 includes two display portions (5303 and 5304), the number of display portions are not limited to two, and may be one or three or more.

Figure 28C:
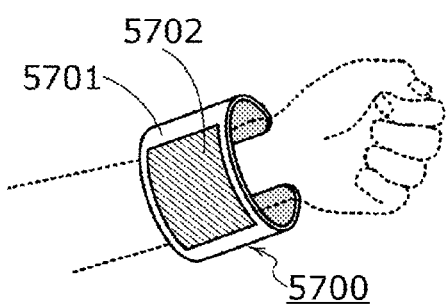

An information terminal 5700 illustrated in FIG. 28C is an example of a wearable information terminal. The information terminal 5700 includes a bangle-type housing 5701, a display portion 5702, and the like. The display portion 5702 is supported by the housing 5701 with a curved surface. A display panel formed with a flexible substrate is provided in the display portion 5702, whereby the information terminal 5700 can be a user-friendly information terminal that is flexible and lightweight.

Figure 28D:
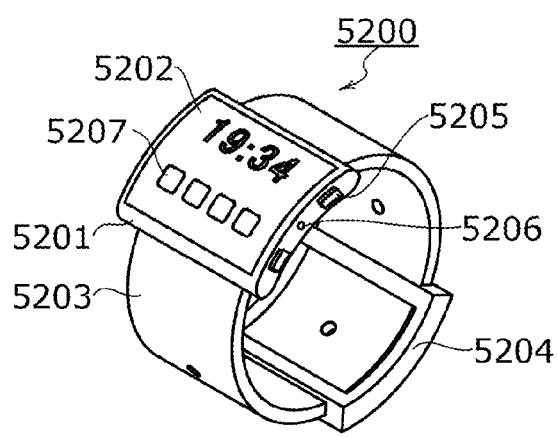

An information terminal 5200 illustrated in FIG. 28D is an example of a wearable information terminal. The information terminal 5200 is a watch-type information terminal and includes a housing 5201, a display portion 5202, a band 5203, a buckle 5204, operation buttons 5205, an input output terminal 5206, and the like. The information terminal 5200 is capable of executing a variety of applications such as mobile phone calls, e-mailing, viewing and editing texts, music reproduction, Internet communication, and computer games.

The display surface of the display portion 5202 is bent, and images can be displayed on the bent display surface. The display portion 5202 includes a touch sensor, and operation can be performed by touching the screen with a finger, a stylus, or the like. For example, by touching an icon 5207 displayed on the display portion 5202, an application can be started. With the operation button 5205, a variety of functions such as time setting, ON/OFF of the power, ON/OFF of wireless communication, setting and cancellation of a silent mode, and setting and cancellation of a power saving mode can be performed. For example, the functions of the operation button 5205 can be set by setting the operating system incorporated in the information terminal 5200.

The information terminal 5200 can employ near field communication conformable to a communication standard. In that case, for example, mutual communication between the information terminal 5200 and a headset capable of wireless communication can be performed, and thus hands-free calling is possible. Moreover, the information terminal 5200 includes the input output terminal 5206, and data can be directly transmitted to and received from another information terminal via a connector. Charging via the input output terminal 5206 is possible. Note that the charging operation may be performed by wireless power feeding without using the input output terminal 5206.

Figure 28E:
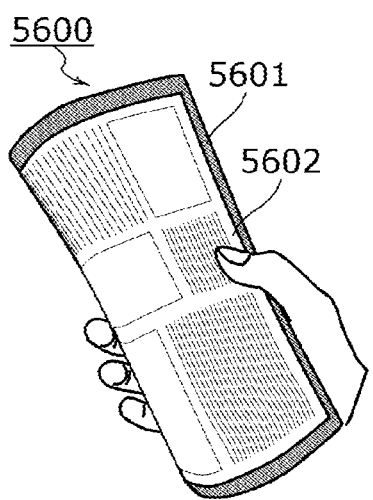

An e-book reader 5600 illustrated in FIG. 28E includes a housing 5601, a display portion 5602, and the like. A display panel formed with a flexible substrate is provided in the display portion 5602. Thus, the e-book reader 5600 can be a user-friendly e-book reader that is flexible and lightweight.

Figure 28F:
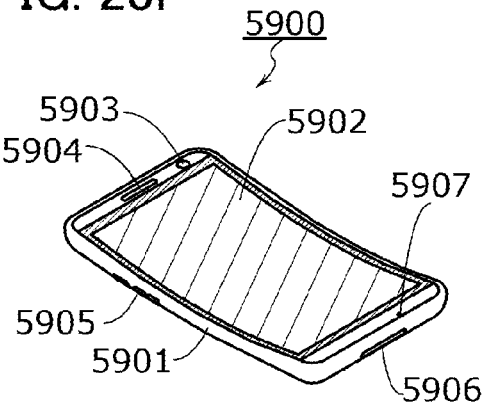

An information terminal 5900 illustrated in FIG. 28F includes a housing 5901, a display portion 5902, a microphone 5907, a speaker portion 5904, a camera 5903, an external connection portion 5906, an operation button 5905, and the like. The display portion 5902 is provided with a display panel formed with a flexible substrate. The information terminal 5900 can be used as, for example, a smartphone, a mobile phone, a tablet information terminal, a tablet PC, or an e-book reader.

(Embodiment 4)

In this embodiment, an oxide semiconductor, an OS transistor, and the like are described.

<<OS Transistor Structure Example 1>>

Figure 29A:
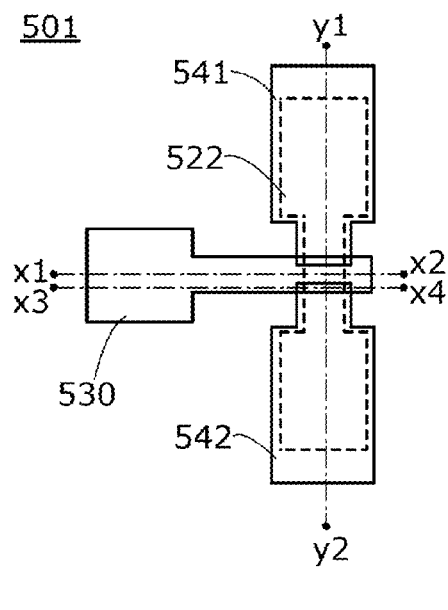
FIG. 29A is a plan view illustrating a structure example of an OS transistor.
Figure 29B:
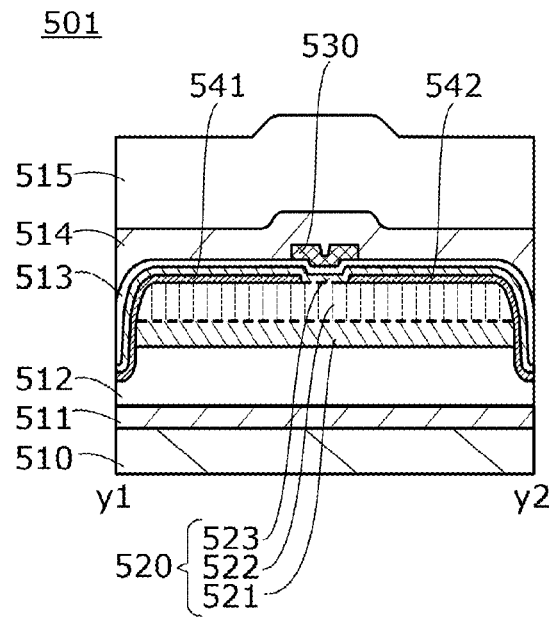
FIGS. 29B to 29D are cross-sectional views of FIG. 29A.
Figure 29C:
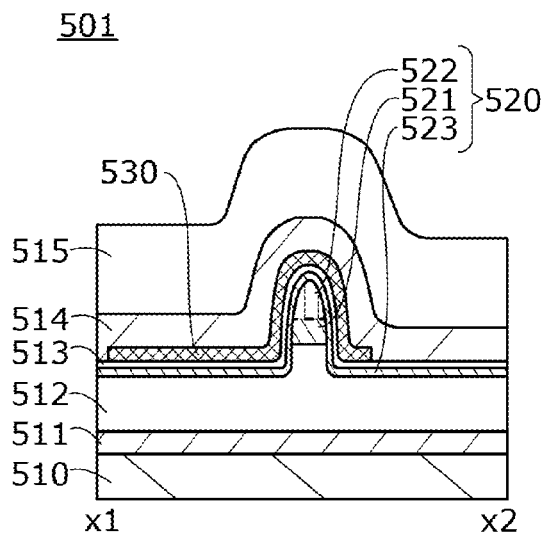
Figure 29D:
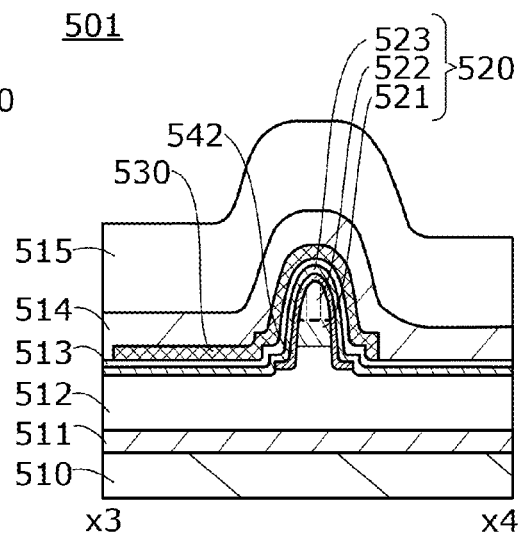

FIGS. 29A to 29D illustrate a structure example of an OS transistor. FIG. 29A is a top view illustrating the structure example of the OS transistor. FIG. 29B is a cross-sectional view taken along line y1-y2, FIG. 29C is a cross-sectional view taken along line x1-x2, and FIG. 29D is a cross-sectional view taken along line x3-x4. Here, in some cases, the direction of the line y1-y2 is referred to as a channel length direction, and the direction of the line x1-x2 is referred to as a channel width direction. Accordingly, FIG. 29B illustrates a cross-sectional structure of the OS transistor in the channel length direction, and FIGS. 29C and 29D each illustrate a cross-sectional structure of the OS transistor in the channel width direction. Note that to clarify the device structure, FIG. 29A does not illustrate some components.

An OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor (OS) layers 521 to 523, a conductive layer 530, a conductive layer 541, and a conductive layer 542. The insulating layer 513 includes a region functioning as a gate insulating layer. The conductive layer 530 functions as a gate electrode. Here, the OS layers 521, 522, and 523 are collectively referred to as an OS layer 520.

As illustrated in FIGS. 29B and 29C, the OS layer 520 includes a region where the OS layer 521, the OS layer 522, and the OS layer 523 are stacked in this order. The insulating layer 513 covers this stacked region. The conductive layer 530 overlaps the stacked region with the insulating layer 513 positioned therebetween. The conductive layer 541 and the conductive layer 542 are provided over the stacked film formed of the OS layer 521 and the OS layer 523 and are in contact with a top surface of this stacked film and a side surface positioned in the channel length direction of the stacked film. In the example of FIGS. 29A to 29D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed so as to surround, in the channel width direction, the region where the OS layers 521 to 523 are stacked in the OS layer 520 with the insulating layer 513 positioned therebetween (see FIG. 29C). Therefore, a gate electric field in the vertical direction and a gate electric field in the lateral direction are applied to this stacked region. In the OS transistor 501, the "gate electric field" refers to an electric field generated by voltage applied to the conductive layer 530 (gate electrode layer). Accordingly, the whole stacked region of the OS layers 521 to 523 can be electrically surrounded by the gate electric fields, so that a channel is formed in the whole OS layer 522 (bulk), in some cases. Thus, high on-state current of the OS transistor 501 can be achieved.

In this specification, a structure of a transistor in which a semiconductor is electrically surrounded by a gate electric field in the above transistor is referred to as a surrounded channel (s-channel) structure. The OS transistor 501 has the s-channel structure. With this s-channel structure, a large amount of current can flow between the source and the drain of the transistor, so that a high drain current in an on state (on-state current) can be achieved.

By employing the s-channel structure in the OS transistor 501, channel formation region controllability by a gate electric field applied to the side surface of the OS layer 522 becomes easy. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Therefore, this is suitable for miniaturization.

When an OS transistor has a three-dimensional structure as in the OS transistor 501 illustrated in FIGS. 29A to 29D, the channel length can be less than 100 nm. By miniaturization of the OS transistor, circuit area can be made small. The channel length of the OS transistor is preferably less than 65 nm, further preferably less than or equal to 30 nm or less than or equal to 20 nm. The channel length is at least 10 nm.

A conductor functioning as a gate of a transistor is referred to as a gate electrode. A conductor functioning as a source of a transistor is referred to as a source electrode. A conductor functioning as a drain of a transistor is referred to as a drain electrode. A region functioning as a source of a transistor is referred to as a source region. A region functioning as a drain of a transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Layer>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, more preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) so as to have a flat surface.

The insulating layers 511 and 512 can be formed using an insulating material of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials.

<Gate Electrode>

The conductive layer 530 is preferably formed using a metal selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy containing any of these metals as its main component; or a compound containing any of these metals as its main component.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Layer>

The insulating layer 513 is formed using an insulating film having a single-layer structure or a layered structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably contains hafnium oxide, and silicon oxide or silicon oxynitride.

Hafnium oxide has a higher dielectric constant than silicon oxide and silicon oxynitride. Therefore, the insulating layer 513 using hafnium oxide can have a larger thickness than the insulating layer 513 using silicon oxide, so that leakage current due to tunnel current can be reduced. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

<Source Electrode, Drain Electrode, Back Gate Electrode>

The conductive layers 541 and 542 can be formed in a manner similar to that of the conductive layer 530. A Cu—Mn alloy film is preferably used for the conductive layers 541 and 542 because of its low electrical resistance, because it forms manganese oxide at the interface with an oxide semiconductor film when formed in contact with the oxide semiconductor film, and because manganese oxide can prevent Cu diffusion. Furthermore, a conductive layer 531 described later (FIGS. 31A to 31C) can be formed in a manner similar to that of the conductive layer 530.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a stacked-layer structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Oxide Semiconductor Layer>

As the semiconductor material of the OS layers 521 to 523, typically, an In—Ga oxide, an In—Zn oxide, or an In-M-Zn oxide (M is Ga, Y, Sn, Zr, La, Ce, Nd, or the like) is used. The element M is an element having a high bonding energy with oxygen, for example. Alternatively, the element M is an element whose bonding energy with oxygen is higher than that of indium. The OS layers 521 to 523 are not limited to the oxide layers containing indium. The OS layers 521 to 523 can be formed using a Zn—Sn oxide layer, a Ga—Sn oxide layer, or a Zn—Mg oxide layer, for example. The OS layer 522 is preferably formed using an In-M-Zn oxide. The OS layers 521 and 523 can be formed using a Ga oxide.

The OS layer 522 is not limited to the oxide semiconductor containing indium. The OS layer 522 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the OS layer 522, an oxide with a wide energy gap may be used. The energy gap of the OS layer 522 is, for example, 2.5 eV or larger and 4.2 eV or smaller, preferably 2.8 eV or larger and 3.8 eV or smaller, more preferably 3 eV or larger and 3.5 eV or smaller.

The OS layer 522 is preferably a CAAC-OS film which will be described later. When the oxide semiconductor contains Zn, the oxide semiconductor is easily to be crystallized, for example. Thus, the OS layer 522 preferably contains Zn.

When an interface level is formed at the interface between the OS layer 522 and the OS layer 521, a channel region is formed also in the vicinity of the interface, which causes a change in the threshold voltage of the OS transistor 501. It is preferable that the OS layer 521 contains at least one of the metal elements contained in the OS layer 522. Accordingly, an interface level is unlikely to be formed at the interface between the OS layer 522 and the OS layer 523, and variations in the electrical characteristics of the OS transistor 501, such as the threshold voltage can be reduced.

The OS layer 523 preferably contains at least one of the metal elements contained in the OS layer 522 because interface scattering is unlikely to occur at the interface between the OS layer 522 and the OS layer 523, and carrier transfer is not inhibited. Thus, the field-effect mobility of the OS transistor 501 can be increased.

The OS layers 521, 522, and 523 preferably include at least Indium. In the case of using an In-M-Zn oxide as the OS layer 521, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the OS layer 522, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the OS layer 523, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the OS layer 523 may be an oxide that is the same type as that of the OS layer 521. Note that the OS layer 521 and/or the OS layer 523 do/does not necessarily contain indium in some cases. For example, the OS layer 521 and/or the OS layer 523 can be formed using a gallium oxide film.

It is preferable that the OS layer 522 have the highest carrier mobility among the OS layers 521 to 523. Accordingly, a channel can be formed in the OS layer 522 that is apart from the insulating layer 511.

In an oxide containing In such as an In-M-Zn oxide, carrier mobility can be increase by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

When an oxide semiconductor film is deposited by a sputtering method, because of heating of a substrate surface (the surface on which the CAAC-OS is deposited), space heating, or the like, the composition of the film is sometimes different from that of a target as a source or the like. For example, in the case of using a target of an In—Ga—Zn oxide, since zinc oxide sublimates more easily than indium oxide, gallium oxide, or the like, the source and the In—Ga—Zn oxide are likely to have different compositions. Specifically, the content of Zn is smaller than that of the source in the In—Ga—Zn oxide. Thus, the source is preferably selected taking into account the change in composition. Note that a difference between the compositions of the source and the film is also affected by a pressure or a gas used for the deposition as well as a temperature.

In the case where the OS layer 522 is an In-M-Zn oxide formed by a sputtering method, it is preferable that the atomic ratio of metal elements of a target used for depositing the In-M-Zn oxide be In:M:Zn=1:1:1, 3:1:2, or 4:2:4.1. For example, the atomic ratio of metal elements contained in a semiconductor film deposited using a target of In:M:Zn=4:2:4.1 is approximately In:M:Zn=4:2:3.

In the case where each of the OS layers 521 and 523 is an In-M-Zn oxide formed by a sputtering method, it is preferable that the atomic ratio of metal elements of a target used for depositing the In-M-Zn oxide be In:M:Zn=1:3:2 or 1:3:4.

In the case where the oxide semiconductor film is formed by a sputtering method, a power supply device for generating plasma can be an RF power supply device, an AC power supply device, a DC power supply device, or the like as appropriate. As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. Furthermore, a target may be appropriately selected in accordance with the composition of the oxide semiconductor to be formed.

To make the oxide semiconductor intrinsic or substantially intrinsic, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor can be prevented as much as possible.

<Energy Band Structure>

Figure 30A:
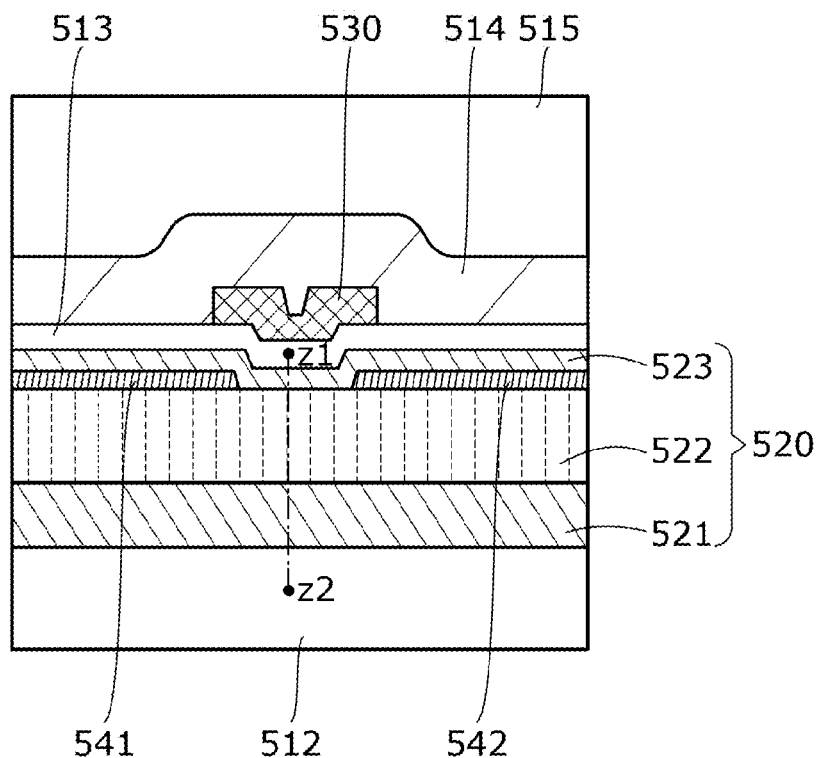
FIG. 30A is a partial enlarged view of FIG. 29B.
Figure 30B:
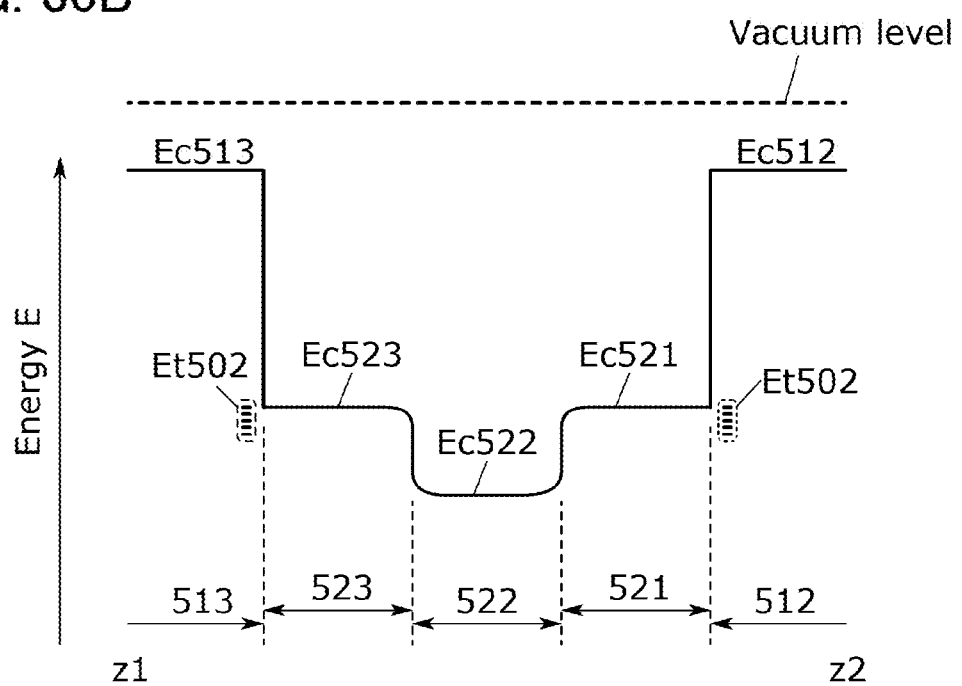
FIG. 30B is an energy band diagram of an OS transistor.

Next, the function and effect of the OS layer 520 in which the OS layers 521, 522, and 523 are stacked are described using an energy band diagram in FIG. 30B. FIG. 30A is an enlarged view of a channel region of the OS transistor 501 in FIG. 29B. FIG. 30B shows an energy band diagram of a portion taken along dotted line z1-z2 (the channel formation region of the OS transistor 501) in FIG. 30A. The OS transistor 501 is described below as an example, but the same applies to the OS transistors 502 to 506.

In FIG. 30B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

The OS layer 522 is an oxide layer which has a larger electron affinity than the OS layers 521 and 523. For example, as the OS layer 522, an oxide having higher electron affinity than those of the OS layer 521 and the OS layer 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

When voltage is applied to the gate (the conductive layer 530) of the OS transistor 501, a channel is formed in the OS layer 522 having the highest electron affinity among the OS layers 521, 522, and 523.

An indium gallium oxide has small electron affinity and a high oxygen-blocking property. Therefore, the OS layer 523 preferably contains an indium gallium oxide. The gallium atomic ratio [Ga/(In+Ga)] is, for example, higher than or equal to 70%, preferably higher than or equal to 80%, more preferably higher than or equal to 90%.

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

In some cases, there is a mixed region of the OS layer 521 and the OS layer 522 between the OS layer 521 and OS layer 522. Furthermore, in some cases, there is a mixed region of the OS layer 523 and the OS layer 522 between the OS layer 523 and OS layer 522. Because the mixed region has a low interface state density, a stack of the OS layers 521 to 523 (the OS layer 520) has a band structure where energy at each interface and in the vicinity of the interface is changed continuously (continuous junction).

Electrons transfer mainly through the OS layer 522 in the OS layer 520 having such an energy band structure. Therefore, even if an interface state exists at the interface between the OS layer 521 and the insulating layer 512 or the interface between the OS layer 523 and the insulating layer 513, electron movement in the OS layer 520 is less likely to be inhibited and the on-sate current of the OS transistor 501 can be increased.

Although trap states Et502 due to impurities or defects might be formed in the vicinity of the interface between the OS layer 521 and the insulating layer 512 and the interface between the OS layer 523 and the insulating layer 513 as illustrated in FIG. 30B, the OS layer 522 can be separated from the trap states Et502 owing to the existence of the OS layers 521 and 523. In the transistor 501, in the channel width direction, the top surface and side surfaces of the OS layer 522 are in contact with the OS layer 523, and the bottom surface of the OS layer 522 is in contact with the OS layer 521 (see FIG. 29C). Surrounding the OS layer 522 by the OS layers 521 and 523 in this manner can further reduce the influence of the trap states Et502.

However, when the energy difference between Ec522 and Ec521 or Ec523 is small, an electron in the OS layer 522 might reach the trap state by passing over the energy difference. Since the electron is trapped in the trap level, negative fixed electric charge is caused at the interface with the insulating film; thus, the threshold voltage of the transistor is shifted in a positive direction. Therefore, each of the energy gaps between Ec521 and Ec522 and between Ec522 and Ec523 is preferably 0.1 eV or more, or further preferably 0.15 eV or more, in which case a change in the threshold voltage of the OS transistor 501 can be reduced and the OS transistor 501 can have favorable electrical characteristics.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in the channel formation region is large. The electron movement is also inhibited, for example, in the case where the density of defect states is high in a region where a channel is formed.

To increase the on-state current of the OS transistor 501, for example, root mean square (RMS) roughness with a measurement area of 1 μm×1 μm of a top surface or a bottom surface of the OS layer 522 (a formation surface; here, the OS layer 521) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm.

For example, in the case where the OS layer 522 contains oxygen vacancies (also denoted by $V_o$), donor levels are formed by entry of hydrogen into sites of oxygen vacancies in some cases. A state in which hydrogen enters sites of oxygen vacancies are denoted by $V_oH$ in the following description in some cases. $V_oH$ is a factor of decreasing the on-state current of the transistor because $V_oH$ scatters electrons. Note that sites of oxygen vacancies become more stable by entry of oxygen than by entry of hydrogen. Thus, by decreasing oxygen vacancies in the OS layer 522, the on-state current of the transistor can be increased in some cases. For example, the hydrogen concentration at a certain depth in the OS layer 522 or in a certain region of the OS layer 522, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

To decrease oxygen vacancies in the OS layer 522, for example, there is a method in which excess oxygen in the insulating layer 512 is moved to the OS layer 522 through the OS layer 521. In this case, the OS layer 521 is preferably a layer having an oxygen-transmitting property (a layer through which oxygen passes or is transmitted).

In the case where the OS transistor 501 has an s-channel structure, a channel can be formed in the whole OS layer 522. The thickness of the OS layer 522 may be greater than or equal to 10 nm and less than or equal to 100 nm, or greater than or equal to 10 nm and less than or equal to 30 nm.

Moreover, the thickness of the OS layer 523 is preferably small to increase the on-state current of the transistor. The thickness of the OS layer 523 is less than 10 nm, preferably less than or equal to 5 nm, or further preferably less than or equal to 3 nm, for example. Meanwhile, the OS layer 523 has a function of blocking entry of elements other than oxygen (such as hydrogen and silicon) included in the adjacent insulator into the OS layer 522. Thus, the OS layer 523 preferably has a certain thickness. For example, the OS layer 523 has a region with a thickness of greater than or equal to 0.3 nm, preferably greater than or equal to 1 nm, more preferably greater than or equal to 2 nm. The OS layer 523 preferably has an oxygen blocking property to suppress outward diffusion of oxygen released from an insulating film 652 and the like.

To improve reliability, preferably, the thickness of the OS layer 521 is large and the thickness of the OS layer 523 is small. For example, the OS layer 521 has a region with a thickness of, for example, greater than or equal to 10 nm, preferably greater than or equal to 20 nm, further preferably greater than or equal to 40 nm, still further preferably greater than or equal to 60 nm. When the thickness of the OS layer 521 is made large, a distance from an interface between the adjacent insulator and the OS layer 521 to the OS layer 522 in which a channel is formed can be large. Since the productivity of the semiconductor device might be decreased, the OS layer 521 has a region with a thickness of, for example, less than or equal to 200 nm, preferably less than or equal to 120 nm, further preferably less than or equal to 80 nm.

In order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $1\times10^{17}/cm^3$, preferably lower than $1\times10^{15}/cm^3$, more preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 29A to 29D show examples in which the OS layer 520 has a three-layer structure; however, the present invention is not limited thereto. For example, the OS layer 520 may have a two-layer structure without the OS layer 521 or the OS layer 523. Alternatively, the OS layer 520 may have a four-layer structure in which any one of the oxide semiconductors described as the OS layers 521, 522 and 523 is provided below or over the OS layer 521 or below or over the OS layer 523. Alternatively, the OS layer 520 may have an n-layer structure (n is an integer of 5 or more) in which any one of the oxide semiconductors (e.g., the OS layers 521 to 523) is provided at two or more of the following positions: between arbitrary layers in the OS layer 520, over the OS layer 520, and below the OS layer 520.

<<OS Transistor Structure Example 2>>

Figure 31A:
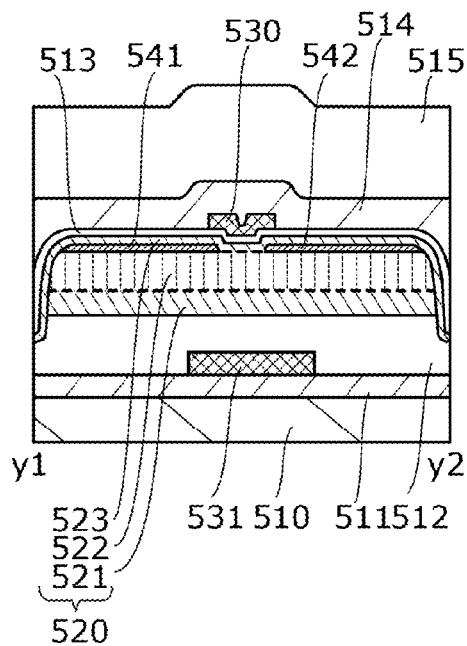
FIGS. 31A to 31C are cross-sectional views each illustrating a structure example of an OS transistor.

The OS transistor 502 in FIG. 31A is a modification example of the OS transistor 501. Like the OS transistor 501, the OS transistor 502 illustrated also has an s-channel structure. The OS transistor 502 is different from the OS transistor 501 in the shapes of the conductive layers 541 and 542 and in that the conductive layer 531 is provided over the insulating layer 511.

The conductive layer 531 functions as a back gate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

The conductive layer 541 and the conductive layer 542 in the OS transistor 502 are formed from a hard mask used for forming the stacked film of the OS layer 521 and the OS layer 522. Therefore, the conductive layer 541 and the conductive layer 542 do not have regions in contact with the side surfaces of the OS layer 521 and the OS layer 522. For example, through the following steps, the OS layers 521 and 522 and the conductive layers 541 and 542 can be formed. A two-layer oxide semiconductor film including the OS layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

The conductive layer 531 can function as a back gate electrode of the OS transistor 502. The conductive layer 531 can be provided in the OS transistor 501 in FIGS. 29A to 29D, and OS transistors 503 to 506 (FIGS. 31B and 31C and FIGS. 32A and 32B) which will be described later.

<<OS Transistor Structure Examples 3 and 4>>

Figure 31B:
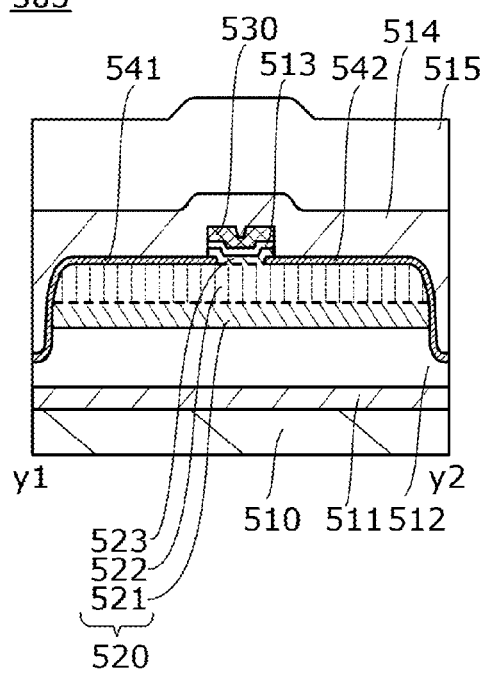
Figure 31C:
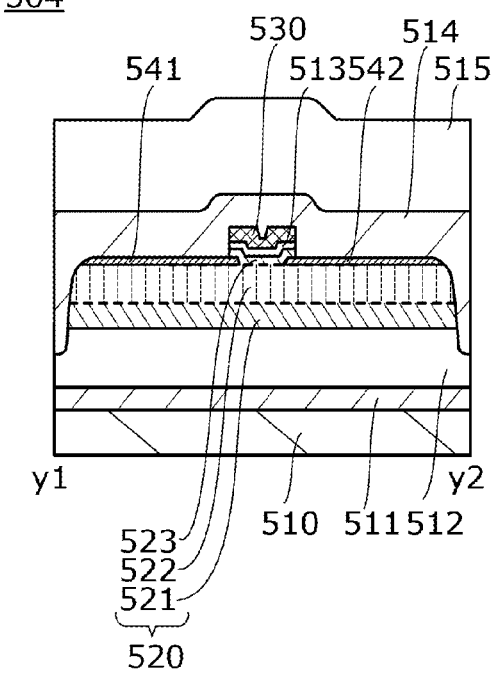

An OS transistor 503 illustrated in FIG. 31B is a modification example of the OS transistor 501, and an OS transistor 504 illustrated in FIG. 31C is a modification example of the OS transistor 502. In each of the OS transistors 503 and 504, the OS layer 523 and the insulating layer 513 are etched using the conductive layer 530 as a mask. Thus, an edge of the OS layer 523 and an edge of the insulating layer 513 are substantially aligned with an edge of the conductive layer 530.

<<OS Transistor Structure Examples 5 and 6>>

Figure 32A:
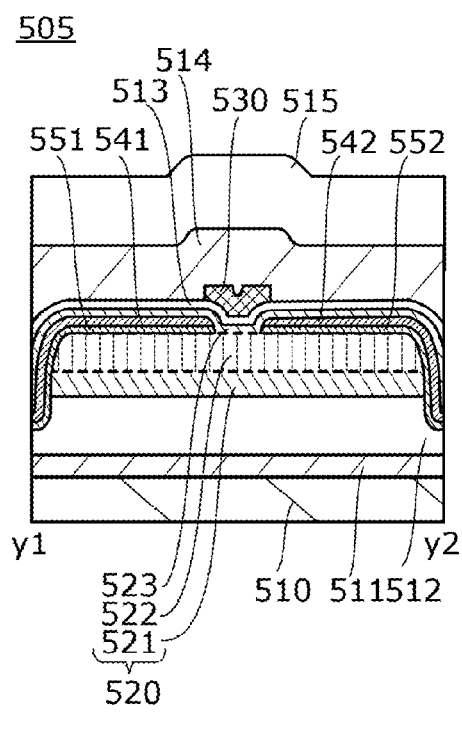
FIGS. 32A and 32B are cross-sectional views each illustrating a structure example of an OS transistor.
Figure 32B:
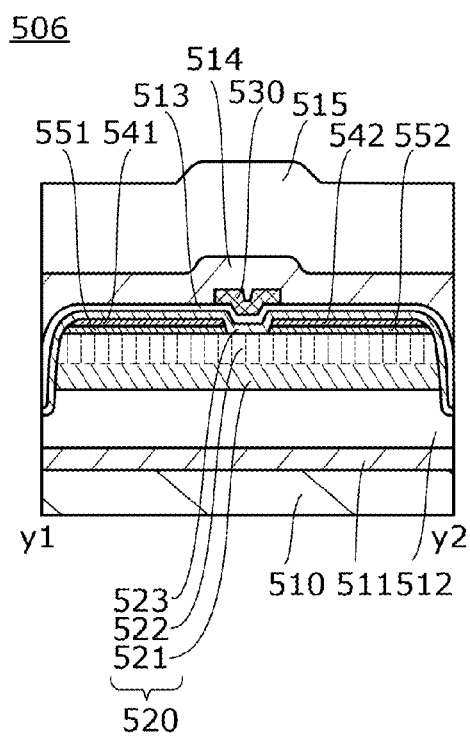

An OS transistor 505 illustrated in FIG. 32A is a modification example of the OS transistor 501, and an OS transistor 506 illustrated in FIG. 32B is a modification example of the OS transistor 502. The OS transistor 505 has a layer 551 between the OS layer 523 and the conductive layer 541. The OS transistor 506 has a layer 552 between the OS layer 523 and the conductive layer 542.

The layers 551 and 552 can each be formed using a layer of a transparent conductor, an oxide semiconductor, a nitride semiconductor, or an oxynitride semiconductor, for example. The layers 551 and 552 can be formed using an n-type oxide semiconductor layer or can be formed using a conductive layer that has higher resistance than the conductive layers 541 and 542. The layers 551 and 552 may be formed using, for example, any of a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, and the like. Any of these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

The layers 551 and 552 are preferably formed using a layer that does not form a Schottky barrier with the OS layer 532. Thus, on-state characteristics of the OS transistors 505 and 506 can be improved.

Note that the layers 551 and 552 preferably have higher resistance than the conductive layers 541 and 542. The layers 551 and 552 each preferably have resistance lower than the channel resistances of the OS transistors 505 and 506. For example, the layers 551 and 552 may have resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with small channel length can have favorable saturation characteristics. Note that in a circuit configuration where the sources and the drains of the OS transistors 505 and 506 do not interchange during the operation, only one of the layers 551 and 552 (e.g., the layer on the drain side) may be preferably provided.

<<Structure of Oxide Semiconductor>>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), and an amorphous oxide semiconductor. From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°. In this specification, trigonal and rhombohedral crystal systems are included in a hexagonal crystal system.

<CAAC-OS>

A CAAC-OS is one of oxide semiconductors having a plurality of c-axis aligned crystal parts (also referred to as pellets). Note that a CAAC-OS can be referred to as an oxide semiconductor including c-axis aligned nanocrystals (CANC).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), a peak is not clearly observed. In contrast, in the case of a single crystal oxide semiconductor of $InGaZnO_4$, when $\phi$ scan is performed with $2\theta$ fixed at around 56°, six peaks which are derived from crystal planes equivalent to the (110) plane are observed. Accordingly, the structural analysis using XRD shows that the directions of a-axes and b-axes are irregularly oriented in the CAAC-OS. The electron diffraction also indicates that crystal parts included in the CAAC-OS have c-axis alignment and that the c-axes are aligned in a direction substantially perpendicular to the formation surface or the top surface of the CAAC-OS.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies. The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has a negative threshold voltage (is rarely normally on). The highly purified intrinsic or substantially highly purified intrinsic oxide semiconductor has few carrier traps. Charges trapped by the carrier traps in the oxide semiconductor take a long time to be released. The trapped charges may behave like fixed electric charges. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). For example, in a high-resolution TEM image of the nc-OS film, a grain boundary is not always found clearly. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor having more regularity than an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

The amorphous oxide semiconductor is such an oxide semiconductor having disordered atomic arrangement and no crystal part. For example, the amorphous oxide semiconductor does not have a specific state as in quartz. In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called amorphous oxide semiconductors or completely amorphous oxide semiconductors.

<Amorphous-like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed. The a-like OS has an unstable structure because it contains a void. Furthermore, the a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Oxide semiconductors have various structures and various properties. A semiconductor layer of an OS transistor may be formed using a stacked film including two or more of an amorphous oxide semiconductor, an a-like OS, a microcrystalline oxide semiconductor, and a CAAC-OS, for example.

This application is based on Japanese Patent Application serial no. 2014-201056 filed with Japan Patent Office on Sep. 30, 2014, the entire contents of which are hereby incorporated by reference.

What is claimed is:

1. A logic circuit comprising:
a first wiring, a first transistor, and a first node, the first transistor connecting the first node to the first wiring;
a second wiring, a second transistor, and a second node, the second transistor connecting the second node to the second wiring;
a third wiring, a third transistor, and a third node, the third transistor connecting the third node to the third wiring;
a dynamic logic circuit comprising fourth transistors in a circuit connected between the first node and the second node; and
a capacitor,
wherein the second node is electrically connected to the third node via the capacitor.

2. The logic circuit according to claim 1, wherein the fourth transistors each include an oxide semiconductor comprising a channel formation region.

3. A logic circuit comprising:
a first wiring, a first transistor, and a first node, the first transistor connecting the first node to the first wiring;
a second wiring, a second transistor, and a second node, the second transistor connecting the second node to the second wiring;
a third wiring, a third transistor, and a third node, the third transistor connecting the third node to the third wiring;
a dynamic logic circuit comprising fourth transistors in a circuit connected between the first node and the second node;
a fourth wiring and a first capacitor, the first capacitor connecting the second node to the fourth wiring; and
a second capacitor,
wherein the second node is electrically connected to the third node via the second capacitor.

4. The logic circuit according to claim 3, wherein the fourth transistors and the third transistor each include an oxide semiconductor comprising a channel formation region.

5. A semiconductor device comprising:
additional wirings; and
AND circuits,
wherein the AND circuits each include the logic circuit according to claim 1,
wherein each of the additional wirings is electrically connected to a corresponding one of output nodes of the AND circuits, and
wherein the semiconductor device is configured to select one wiring of the additional wirings by logical operation of the AND circuits.

6. A semiconductor device comprising:
additional wirings; and
AND circuits,
wherein the AND circuits each include the logic circuit according to claim 3,
wherein each wiring of the additional wirings is electrically connected to a corresponding one of output nodes of the AND circuits, and
wherein the semiconductor device is configured to select one wiring of the additional wirings by logical operation of the AND circuits.

7. A semiconductor device comprising:
a circuit array of a plurality of circuits; and
a peripheral circuit for driving the circuit array,
wherein the peripheral circuit includes the logic circuit according to claim 1.

8. A semiconductor device comprising:
a circuit array of a plurality of circuits; and
a peripheral circuit for driving the circuit array,
wherein the peripheral circuit includes the logic circuit according to claim 3.

9. An electronic component comprising:
a substrate on which the logic circuit according to claim 1 is formed; and
a lead electrically connected to the logic circuit.

10. An electronic component comprising:
a substrate on which the logic circuit according to claim 3 is formed; and
a lead electrically connected to the logic circuit.

11. An electronic device comprising:
the logic circuit according to claim 1; and
at least one of a display device, a touch panel, a microphone, a speaker, an operation key, and a housing.

12. An electronic device comprising:
the logic circuit according to claim 3; and
at least one of a display device, a touch panel, a microphone, a speaker, an operation key, and a housing.

13. The logic circuit according to claim 1, wherein a gate electrode of the third transistor is directly connected to a node connected to the capacitor via a source and a drain of the third transistor.

14. The logic circuit according to claim 3, wherein a gate electrode of the third transistor is directly connected to a node connected to the second capacitor via a source and a drain of the third transistor.

15. An electronic component comprising the logic circuit according to claim 13, configured so that, in operation:
- a power supply voltage applied to the third wiring is greater than a power supply voltage applied to the first wiring, and
- the power supply voltage applied to the first wiring is greater than a power supply voltage applied to the second wiring.

16. An electronic component comprising the logic circuit according to claim 14, configured so that, in operation:
- a power supply voltage applied to the third wiring is greater than a power supply voltage applied to the first wiring,
- the power supply voltage applied to the first wiring is greater than a power supply voltage applied to the second wiring and greater than a power supply voltage applied to the fourth wiring.

* * * * *